United States Patent
Khosravani

(10) Patent No.: US 10,739,395 B2
(45) Date of Patent: Aug. 11, 2020

(54) LIGHTNING DIRECT EFFECTS (LDE) TESTING SYSTEM AND METHOD USING A DIGITALLY-CONTROLLED REFERENCE LIGHT SOURCE

(71) Applicant: The Boeing Company, Chicago, IL (US)

(72) Inventor: Shahriar Khosravani, Everett, WA (US)

(73) Assignee: The Boeing Company, Chicago, IL (US)

( * ) Notice: Subject to any disclaimer, the term of this patent is extended or adjusted under 35 U.S.C. 154(b) by 147 days.

(21) Appl. No.: 16/128,706

(22) Filed: Sep. 12, 2018

(65) Prior Publication Data

US 2020/0081051 A1 Mar. 12, 2020

(51) Int. Cl.
*G01R 31/00* (2006.01)
*B64F 5/60* (2017.01)

(52) U.S. Cl.
CPC .............. *G01R 31/001* (2013.01); *B64F 5/60* (2017.01)

(58) Field of Classification Search
CPC .......................... G01R 31/001; G01R 29/0842
USPC .......................................................... 324/72
See application file for complete search history.

(56) References Cited

U.S. PATENT DOCUMENTS 6,903,357 B2 6/2005 Robb
9,514,917 B1 12/2016 McIver et al.
10,317,353 B2 * 6/2019 Khosravani ............ G01R 27/14
2007/0258090 A1 11/2007 Kwon et al.
2013/0242088 A1 * 9/2013 Pons ....................... G01R 31/00
348/135

FOREIGN PATENT DOCUMENTS

JP 2012242307 A * 12/2012
JP 2012242307 A 12/2012
JP 2013200213 A * 10/2013

OTHER PUBLICATIONS

Extended European Search Report (EESR), European Patent Office, dated Feb. 7, 2020, for Application No. EP19196896.5, Applicant The Boeing Company, 8 pages.
(Continued)

*Primary Examiner* — Christopher E Mahoney

(57) ABSTRACT

There is provided an LDE testing system. The system has a test chamber, a test article, and a capacitor to inject current into the test article, to create a spark, emitting a spark spectral signature, and having a spark light intensity. The system has a digitally-controlled reference light source operable to emit a reference light source spectral signature simulating an observed spark spectral signature of sparking in tested test articles, and having a reference light source light intensity equivalent to an observed spark light intensity. The system has a camera to capture an image of the spark spectral signature, spark light intensity, reference light source spectral signature, and reference light source light intensity, a controller to digitally control the digitally-controlled reference light source, and a computer system to receive the image from the camera, and determine a passing or failing result of an LDE testing criteria for the test article.

20 Claims, 7 Drawing Sheets

(56) References Cited

OTHER PUBLICATIONS

SAEAerospace, AE-2 Lightning Committee, "Aircraft Lightning Test Methods ARP5416A", Standard ARP5416A Revised SAE International in United States, SAE International, US, Jan. 7, 2013, 105 pages.

Evans, Simon et al., "An Introduction to a New Aerospace Lightning Direct Effects Research Programme and the Significance of Zone 2A Waveform Components on Sparking Joints", 2016 33rd International Conference on Lightning Protection (ICLP), IEEE, Sep. 25, 2016, 6 pages.

\* cited by examiner

LIGHTNING DIRECT EFFECTS (LDE) TESTING SYSTEM AND METHOD USING A DIGITALLY-CONTROLLED REFERENCE LIGHT SOURCE

BACKGROUND

1) Field of the Disclosure

The disclosure relates generally to lightning strike testing systems and methods, and more particularly, to lightning direct effects (LDE) testing systems and methods for testing test articles for aircraft structures.

2) Description of Related Art

Composite materials are used in manufacturing various structures of aircraft, including fuselage, wings, tail sections, skin panels, and other structures. A challenge to the use of composite structures, as compared to metal structures, is their susceptibility to the effects of lightning. Composite materials are less conductive than metal materials, and structures made of composite materials may have difficulty dissipating electric charge or energy from a lightning strike, as quickly or efficiently as structures made of metal materials. Lightning strikes to aircraft are of concern because they may result in electrical arcs or heating sufficient to ignite vaporous fuel mixtures.

Aircraft manufacturers design and continually test their aircraft for lightning strike protection. Physical damage to an aircraft occurring at an attachment point of a lightning strike, or arc, and more generally, damage caused by conduction of current into a structure is typically referred to as "lightning direct effects (LDE)". Compliance with applicable regulatory agency requirements for protection against lightning strikes or lightning events requires lightning direct effects (LDE) testing for certification. LDE testing systems and methods typically use a test article, which may be in the form of a model or a component of the aircraft structure, and subject the test article to an energy discharge that simulates and/or generates the lightning strike, or arc. For example, LDE testing systems and methods may use a lightning strike simulator.

Known LDE testing systems and methods typically include testing criteria for passing or failing based on a comparison of an optical signature of sparking or hot particle ejection observed at a test article, such as a composite test article, and an optical signature of a reference sparker that is tuned to release a minimum ignition energy (MIE) of greater than, or equal to, 200 µJ (microjoules), the applicable standard for compliance according to the Federal Aviation Administration (FAA). However, the observed sparking or hot particle ejection at a composite test article repeatedly indicates that the spectral signature of those events are toward the lower end of the visual spectrum, i.e. a reddish-yellow color, while the reference sparker emitted light is on the upper end of the spectrum, i.e. a bluish-purple color. This is due to differences in the nature of light production in these two systems. Moreover, the reference sparker of such known LDE testing systems and methods may be dependent on environmental factors, such as relative humidity, ambient temperature, cosmic rays, and other environmental factors.

In addition, known LDE testing systems and methods typically involve subjective review by users of digital photographic images taken during lightning direct effects (LDE) testing, to determine a light intensity at a spark location on a test article. However, such subjective review may be prone to error and may result in delays in testing, as additional LDE tests may be required if there are inaccurate results.

Further, such known LDE testing systems and methods may be based on calibration of a camera used to take images of a reference sparker, and may require frequent calibration of the camera used to take the images of the reference sparker and the observed sparking or hot particle ejection. The difficulties with such known LDE testing systems and methods arise from a variability in producing a reference sparker image and frequent camera calibrations and settings. In addition, it may be difficult to obtain a repeatable and reliable reference sparker using such known LDE testing systems and methods.

Accordingly, there is a need in the art for an improved lightning direct effects (LDE) testing system and an improved lightning direct effects (LDE) testing method that are repeatable, accurate, automated, programmable, reliable, fast, and simple to set up and use, and that eliminate frequent camera calibration of the camera used to take images of a spark and a reference light source, and that provide advantages over known systems and methods.

SUMMARY

Example implementations of this disclosure provide for an improved lightning direct effects (LDE) testing system and an improved lightning direct effects (LDE) testing method for testing test articles, such as test articles for aircraft structures. As discussed in the below detailed description, versions of LDE testing system and the LDE testing method may provide significant advantages over known systems and methods.

In one version there is provided a lightning direct effects (LDE) testing system. The LDE testing system comprises a test chamber. The LDE testing system further comprises a test article disposed in the test chamber. The LDE testing system further comprises at least one capacitor coupled to the test article. The at least one capacitor is operable to inject a current, simulating a lightning strike, into the test article, to create a spark on the test article. The spark emits a spark spectral signature, and the spark has a spark light intensity. The test article is coupled to a ground wire dissipating the current to a ground.

The LDE testing system further comprises a digitally-controlled reference light source disposed in the test chamber. The digitally-controlled reference light source is operable to emit a reference light source spectral signature simulating an observed spark spectral signature of sparking in tested test articles. The digitally-controlled reference light source has a reference light source light intensity equivalent to an observed spark light intensity of an observed spark having an energy equal to a minimum ignition energy (MIE) threshold.

The LDE testing system further comprises a camera positioned at the test chamber. The camera has a camera lens facing the test article and the digitally-controlled reference light source, and has a field of view to detect the spark and the digitally-controlled reference light source. The camera is operable to capture an image that includes the spark spectral signature, the spark light intensity, the reference light source spectral signature, and the reference light source light intensity.

The LDE testing system further comprises a controller system having a controller operable to digitally control the digitally-controlled reference light source. The controller system has an input portion coupled to the ground wire, via a current sensor probe assembly. The controller system has an output portion coupled to the digitally-controlled reference light source, via a fiber optic link.

The LDE testing system further comprises a computer system coupled to the camera, to receive the image, and to determine a passing result or a failing result of a lightning direct effects (LDE) testing criteria for the test article, by measuring and comparing the spark light intensity of the spark on the test article against the reference light source light intensity of the digitally-controlled reference light source.

In another version there is provided a lightning direct effects (LDE) testing system using a digitally-controlled reference light source. The lightning direct effects (LDE) testing system comprises a test chamber.

The LDE testing system further comprises a test article disposed in the test chamber. The LDE testing system further comprises at least one capacitor coupled, via a capacitor wire, to a first end of the test article. The at least one capacitor is operable to inject a current, simulating a lightning strike, into the test article, to create a spark on the test article. The spark emits a spark spectral signature, and the spark has a spark light intensity.

The LDE testing system further comprises a ground wire coupled to a second end of the test article. The ground wire dissipates the current to a ground. The LDE testing system further comprises a first mirror and a second mirror disposed in the test chamber, opposite each other, with the test article positioned between the first mirror and the second mirror.

The LDE testing system further comprises the digitally-controlled reference light source disposed in the test chamber at a fixed coordinate position proximate to the test article. The digitally-controlled reference light source is operable to emit a reference light source spectral signature simulating an observed spark spectral signature of sparking observed in tested test articles. The digitally-controlled reference light source has a reference light source light intensity that is equivalent to an observed spark light intensity of an observed spark having an energy equal to a minimum ignition energy (MIE) threshold.

The LDE testing system further comprises a camera positioned at the test chamber. The camera has a camera lens facing the test article and the digitally-controlled reference light source. The camera has a field of view to detect the spark and the digitally-controlled reference light source. The camera is operable to capture an image that includes the spark spectral signature, the spark light intensity, the reference light source spectral signature, and the reference light source light intensity.

The LDE testing system further comprises a controller system having a controller operable to digitally control the digitally-controlled reference light source. The LDE testing system further comprises a current sensor probe assembly coupled between the ground wire and the controller system. The current sensor probe assembly comprises a current sensor probe and a cable connection. The LDE testing system further comprises a fiber optic link coupled between the controller system and the digitally-controlled reference light source.

The LDE testing system further comprises a computer system coupled to the camera, to receive the image, and to determine a passing result or a failing result of a lightning direct effects (LDE) testing criteria for the test article, by measuring and comparing the spark light intensity of the spark of the test article against the reference light source light intensity of the digitally-controlled reference light source. If the spark light intensity of the spark is less than the reference light source light intensity in the image captured by the camera, the test article passes the LDE testing criteria. If the spark light intensity of the spark is equal to, or greater than, the reference light source light intensity in the image captured by the camera, the test article fails the LDE testing criteria.

In another version there is provided a lightning direct effects (LDE) testing method using a lightning direct effects (LDE) testing system. The lightning direct effects (LDE) testing method comprises the step of assembling the LDE testing system. The LDE testing system comprises a test chamber, a test article disposed in the test chamber, at least one capacitor coupled, via a capacitor wire, to a first end of the test article (22), a ground wire coupled to a second end of the test article, and a digitally-controlled reference light source disposed in the test chamber at a fixed coordinate position proximate to the test article.

The LDE testing system further comprises a camera positioned at the test chamber. The camera has a camera lens facing the test article and the digitally-controlled reference light source. The LDE testing system further comprises a controller system having an input portion coupled to the ground wire, via a current sensor probe assembly. The controller system has an output portion coupled to the digitally-controlled reference light source, via a fiber optic link. The LDE testing system further comprises a computer system coupled to the camera.

The LDE testing method further comprises the step of injecting a current, simulating a lightning strike, from the at least one capacitor, into the test article, to create a spark, on the test article, and dissipating the current, via the ground wire, to a ground. The spark emits a spark spectral signature, and the spark has a spark light intensity.

The LDE testing method further comprises the step of using the current sensor probe assembly, to sense the current, and to send a current detection signal to the controller system. The LDE testing method further comprises the step of using the controller system having a controller with pulse-duration modulation (PDM), to digitally control the digitally-controlled reference light source, and to produce emitted light.

The LDE testing method further comprises the step of transferring, via the fiber optic link, the emitted light from the controller system to the digitally-controlled reference light source. The LDE testing method further comprises the step of emitting, with the digitally-controlled reference light source, a reference light source spectral signature simulating an observed spark spectral signature of sparking observed in tested test articles. The digitally-controlled reference light source has a reference light source light intensity that is equivalent to an observed spark light intensity of an observed spark having an energy equal to a minimum ignition energy (MIE) threshold.

The LDE testing method further comprises the step of capturing, with the camera, an image that includes the spark spectral signature, the spark light intensity, the reference light source spectral signature, and the reference light source light intensity. The LDE testing method further comprises the step of transferring the image from the camera to the computer system. The LDE testing method further comprises the step of determining, with the computer system, a passing result or a failing result of a lightning direct effects (LDE) testing criteria for the test article, by measuring and comparing the spark light intensity of the spark on the test article against the reference light source light intensity of the digitally-controlled reference light source.

The features, functions, and advantages that have been discussed can be achieved independently in various versions of the disclosure or may be combined in yet other versions, further details of which can be seen with reference to the following description and drawings.

BRIEF DESCRIPTION OF THE DRAWINGS

The disclosure can be better understood with reference to the following detailed description taken in conjunction with the accompanying drawings which illustrate exemplary versions or embodiments, but which are not necessarily drawn to scale, wherein.

Each figure shown in this disclosure shows a variation of an aspect of the versions or embodiments presented, and only differences will be discussed in detail.

DETAILED DESCRIPTION

Disclosed versions or embodiments will now be described more fully hereinafter with reference to the accompanying drawings, in which some, but not all of the disclosed versions or embodiments are shown. Indeed, several different versions may be provided and should not be construed as limited to the versions set forth herein. Rather, these versions are provided so that this disclosure will be thorough and fully convey the scope of the disclosure to those skilled in the art.

Figure 1:
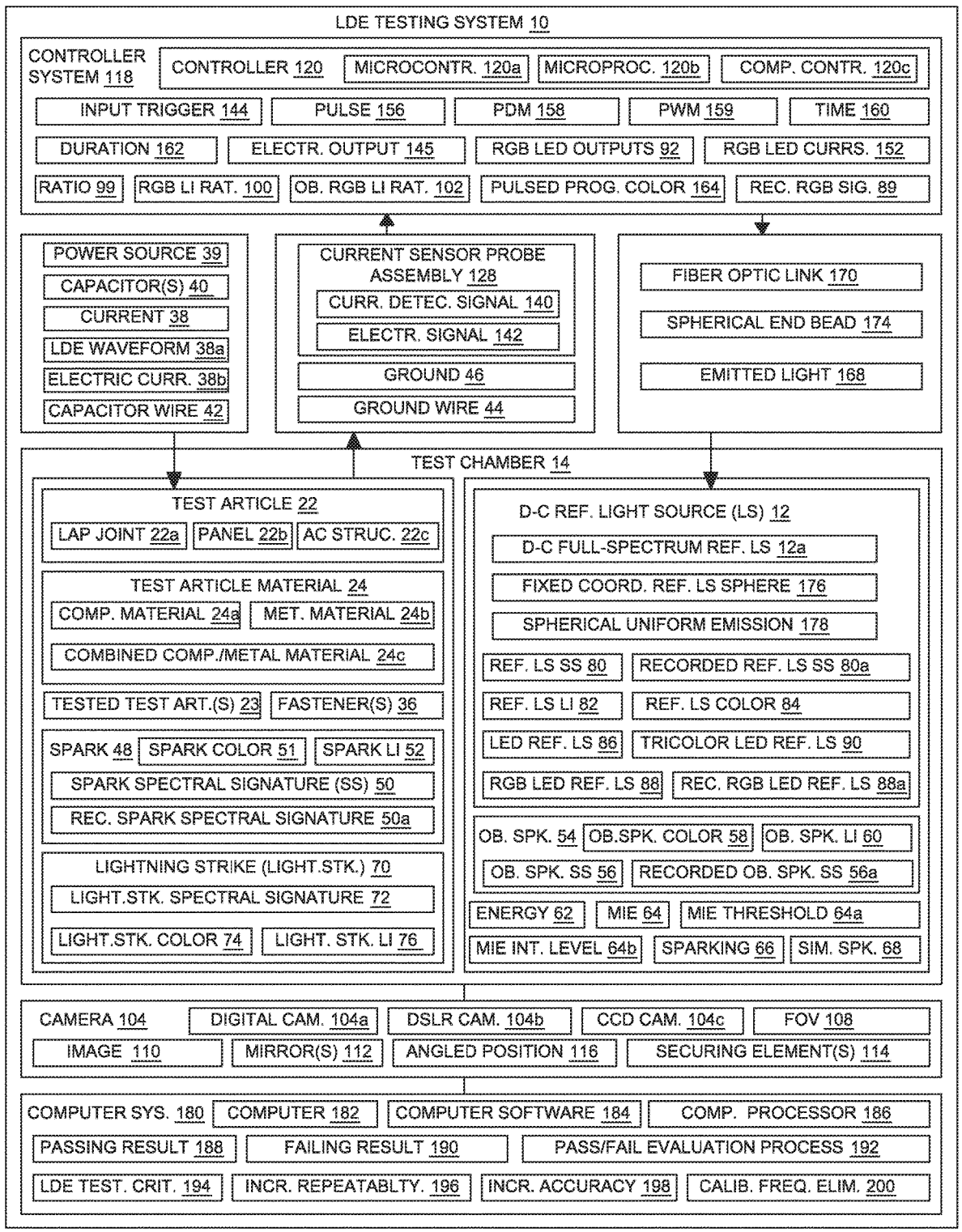
FIG. 1 is an illustration of a functional block diagram of a version of a lightning direct effects (LDE) testing system of the disclosure.
Figure 2A:
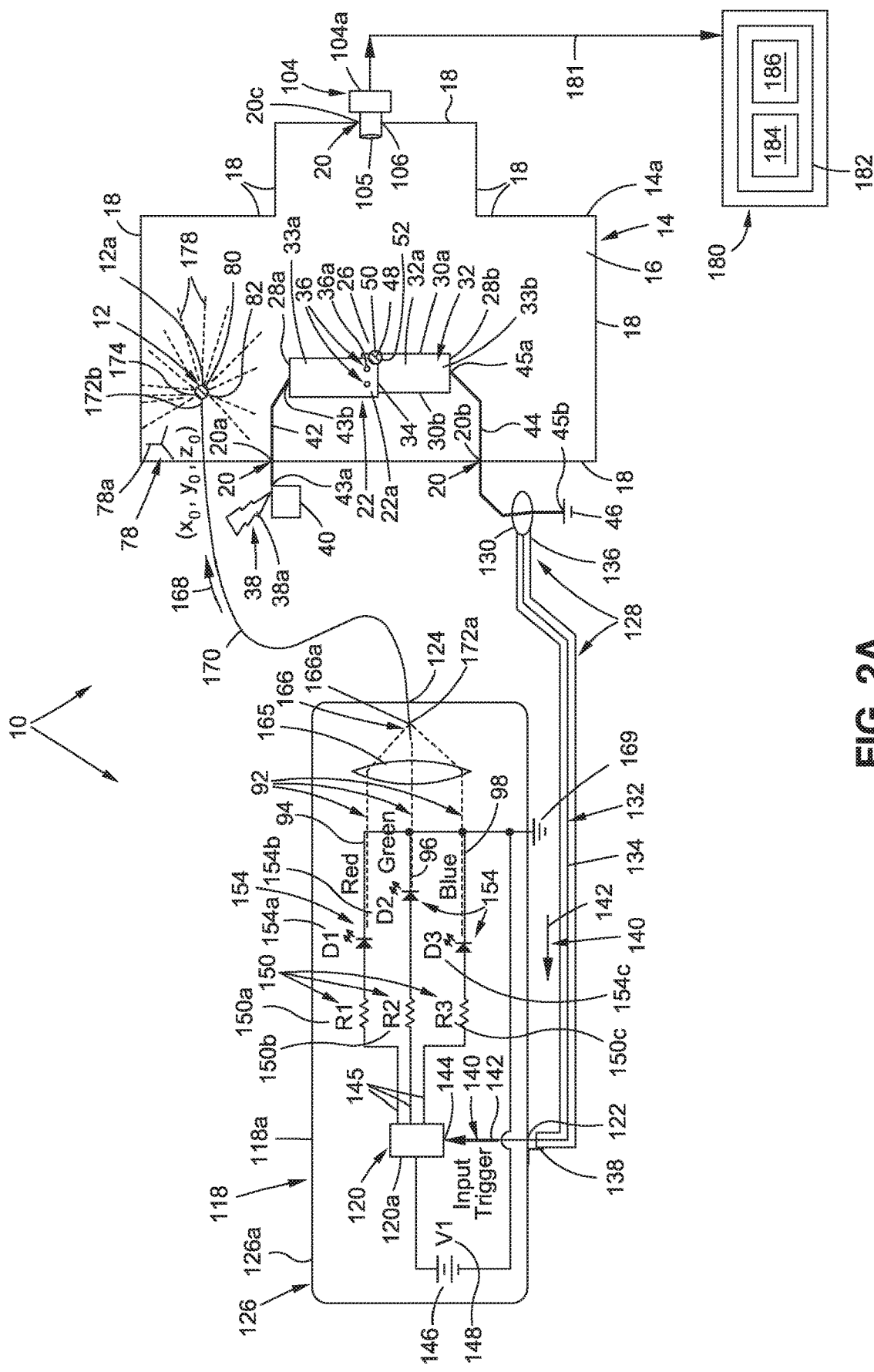
FIG. 2A is an illustration of a schematic diagram showing a top cut-away view of a version of a lightning direct effects (LDE) testing system of the disclosure.

Now referring to the Figures, FIG. 1 is an illustration of a functional block diagram of a version of a lightning direct effects (LDE) testing system 10 of the disclosure, that uses a digitally-controlled reference light source 12, such as in the form of a digitally-controlled full-spectrum reference light source 12a. FIG. 2A is an illustration of a schematic diagram showing a top cut-away view of a version of the lightning direct effects (LDE) testing system 10 of the disclosure.

As shown in FIGS. 1 and 2A, the LDE testing system 10 comprises or includes a test chamber 14, e.g., enclosed area or room. In one exemplary version, as shown in FIG. 2A, the test chamber 14 comprises an enclosed test chamber 14a having an interior 16 and a plurality of walls 18. As further shown in FIG. 2A, the test chamber 14 may have one or more openings 20, including a first opening 20a, a second opening 20b, and a third opening 20c, for insertion or positioning of various connection elements and elements or devices used in testing. The test chamber 14 may have additional openings 20 depending on the type of test chamber 14 used.

As shown in FIGS. 1 and 2A, the LDE testing system 10 further comprises or includes a test article 22, or test specimen. The test article 22 may preferably comprise one of, a lap joint 22a, a panel 22b, an aircraft structure 22c, or another suitable structure or part. For example, the test article 22 may be a model of an aircraft structure 22c, or a component part of the aircraft structure 22c. The test article 22 is not limited to these structures, and other test articles 22, or test specimens, may be used in the LDE testing system 10.

As shown in FIG. 1, the test article 22, or test specimen, is preferably made of a test article material 24 comprising a composite material 24a, a metal material 24b, or a combined composite/metal material 24c. The test article 22 is not limited to being comprised of these materials, and other test article materials 24 may be used.

As shown in FIG. 2A, the test article 22, or test specimen, is disposed, or positioned, at a location 26 in, the interior 16 of the test chamber 14. The location 26 is merely exemplary, and the test article 22 may be disposed, or positioned, at another suitable position in, or within, the interior 16 of the test chamber 14.

As shown in FIG. 2A, the test article 22 comprises a first end 28a, a second end 28b, a front end 30a, and a back end 30b. The test article 22 (see FIGS. 2A, 3A-3B) further comprises sides 32 (see FIGS. 2A, 3A-3B), such as a first side 32a (see FIGS. 2A, 3A-3B), or top side, and such as a second side 32b (see FIGS. 3A-3B), or bottom side. If the test article 22 (see FIGS. 2A, 3A-3B) is in the form of a lap joint 22a (see FIGS. 2A, 3A-3B), the lap joint 22a may comprise a first portion 33a (see FIGS. 2A, 3A-3B) and a second portion 33b (see FIGS. 2A, 3A-3B). The first portion 33a and the second portion 33b may be joined together with one or more fasteners 36 (see FIG. 2A), such as one or more metal fasteners 36a (see FIG. 2A), or one or more fasteners 36 made of another suitable conductive material, to create an interface 34 (see FIGS. 2A, 3A-3B) of the test article 22, at the joining of the first portion 33a and the second portion 33b.

As shown in FIGS. 1 and 2A, the LDE testing system 10 further comprises or includes at least one capacitor 40. Preferably, the at least one capacitor 40 (see FIG. 2A) is coupled to the test article 22 (see FIG. 2A), via a capacitor wire 42 (see FIG. 2A). The capacitor wire 42 (see FIG. 2A) has a first end 43a (see FIG. 2A) and a second end 43b (see FIG. 2A). In one version, as shown in FIG. 2A, the first end 43a of the capacitor wire 42 is attached to the capacitor 40, and the second end 43b of the capacitor wire 42 is attached to the first end 28a of the test article 22. The capacitor wire 42 may be inserted through the opening 20 (see FIG. 2A), such as the first opening 20a (see FIG. 2A), of the test chamber 14 (see FIG. 2A). The capacitor wire 42 is preferably made of a conductive material, such as a conductive metal material, or another suitable conductive material.

The at least one capacitor 40 (see FIGS. 1, 2A) is operable to inject or release, and injects or releases, a current 38 (see FIGS. 1, 2A), such as in the form of a lightning direct effects (LDE) waveform 38a (see FIGS. 1, 2A), into the test article 22, to create a spark 48 (see FIGS. 1, 2A) on, or at, the test article 22. The capacitor 40 preferably subjects the test article 22 to an energy discharge simulating a lightning strike 70 (see FIG. 1), or lightning arc. The current 38 (see FIGS. 1, 2A) is preferably an electric current 38b (see FIGS. 1, 2A) having a high voltage. As shown in FIG. 1, a lightning strike 70 has a lightning strike spectral signature 72, a lightning strike color 74, and a lightning strike light intensity 76.

As shown in FIG. 2A, in one version, the spark 48 is generated at the interface 34 of the test article 22, such as in the form of lap joint 22a, near the fasteners 36, such as the metal fasteners 36a. The spark 48 (see FIGS. 1, 2A) emits a spark spectral signature 50 (see FIGS. 1, 2A), and the spark 48 has a spark color 51 (see FIG. 1) and a spark light intensity 52 (see FIGS. 1, 2A). The spark spectral signature 50 (see FIG. 1) may be photographed or recorded to obtain a recorded spark spectral signature 50a (see FIG. 1).

The at least one capacitor 40 may comprise one capacitor 40, or a plurality or bank of capacitors 40 positioned in parallel with one another. The capacitor 40, or the bank of capacitors 40, is charged with current 38, such as electric current 38b, from a power source 39 (see FIG. 1), and the capacitor 40, or the bank of capacitors 40, stores the electric current 38b as electrical energy. The capacitor 40, or bank of capacitors 40, may each have two or more electrical conductors, such as in the form of conductive metal plates or surfaces, separated by an insulating material, such as a dielectric, for example, ceramic, glass, or another insulating material. The capacitor 40, or the bank of capacitors 40, may include a lightning strike simulator. The lightning strike simulator is used to see the direct effects of lightning on the test article 22, without the risk of a real lightning strike. The lightning strike simulator may mimic different types of lightning strikes 70 (see FIG. 1), for example, a high voltage (megavolt) generator that mimics where the lightning will attach on an aircraft in flight, and for example, a high current (kilovolts) system that may output amps of current to simulate a lightning strike on an aircraft's skin or surface.

As shown in FIGS. 1 and 2A, the LDE testing system 10 further comprises or includes a ground wire 44. The ground wire 44 (see FIG. 2A) has a first end 45a (see FIG. 2A) and a second end 45b (see FIG. 2A). In one version, as shown in FIG. 2A, the first end 45a of the ground wire 44 is attached to the second end 28b of the test article 22, and the second end 45b of the ground wire 44 is attached to a ground 46. The ground wire 44 may be inserted through the opening 20 (see FIG. 2A), such as the second opening 20b (see FIG. 2A), of the test chamber 14 (see FIG. 2A). The ground wire 44 dissipates or discharges the current 38 to the ground 46. The ground wire 44 is preferably made of a conductive material, such as a conductive metal, for example, copper, or another suitable metal material, or suitable conductive material.

As shown in FIGS. 1 and 2A, the LDE testing system 10 further comprises or includes the digitally-controlled reference light source 12, such as the digitally-controlled full-spectrum reference light source 12a. As used herein, "full-spectrum" means light that covers the electromagnetic spectrum from infrared to near-ultraviolet.

As shown in FIG. 2A, the digitally-controlled reference light source 12, such as the digitally-controlled full-spectrum reference light source 12a, is disposed, or positioned at, a position 78, such as a fixed coordinate position 78a, proximate to the test article 22, and to the side of the test article 22, in the interior 16 of the test chamber 14, and on the same end or side of the interior 16 of the test chamber 14. The position 78, such as the fixed coordinate position 78a, is shown in FIG. 2A, and depicted by an axis with ($x_0$, $y_0$, $z_0$) coordinates, to show that the position or location of the digitally-controlled reference light source 12 may be calculated to be the same position fixed within the test chamber 14 for each test performed with the lightning direct effects (LDE) testing system 10.

The digitally-controlled reference light source 12, such as the digitally-controlled full-spectrum reference light source 12a, is operable, set, or programmed, to emit a reference light source spectral signature 80 (see FIGS. 1, 2A, 3A-3B), simulating an observed spark spectral signature 56 (see FIG. 1) of sparking 66 (see FIG. 1), or hot particle ejection, observed in tested test articles 23 (see FIG. 1), such as tested test articles 23 that have been previously and repeatedly tested. Thus, the reference light source spectral signature 80 (see FIGS. 1, 2A, 3A-3B) represents the actual, observed spark spectral signature 56 (see FIG. 1) of sparking 66 (see FIG. 1), or hot particle ejection, in structures 268 (see FIG. 5), such as composite structures 270 (see FIG. 5). This has been repeatedly observed and quantified over many lighting direct effects (LDE) tests. The reference light source spectral signature 80 (see FIG. 1) may be photographed or recorded to obtain a recorded reference light source spectral signature 80a (see FIG. 1).

The observed spark spectral signature 56 (see FIG. 1) is emitted by an observed spark 54 (see FIG. 1). The observed spark 54 has an observed spark color 58 (see FIG. 1) and an observed spark light intensity 60 (see FIG. 1). The observed spark spectral signature 56 (see FIG. 1) may comprise a recorded observed spark spectral signature 56a (see FIG. 1) that has been recorded or photographed. "Spectral signature" means the variation of reflectance or emittance of a material with respect to wavelengths (i.e., reflectance/emittance as a function of wavelength).

The digitally-controlled reference light source 12, such as the digitally-controlled full-spectrum reference light source 12a, has a reference light source light intensity 82 (see FIGS. 1, 2A, 3A-3B) that is preferably equivalent to the observed spark light intensity 60 (see FIG. 1) of the observed spark 54 (see FIG. 1), having an energy 62 (see FIG. 1) equal to a minimum ignition energy (MIE) threshold 64a (see FIG. 1). Further, the digitally-controlled reference light source 12, such as the digitally-controlled full-spectrum reference light source 12a, has a reference light source color 84 (see FIG. 1). A minimum ignition energy (MIE) 64 (see FIG. 1) means a minimum amount of energy required to ignite fuel vapors, and the minimum ignition energy (MIE) threshold 64a set by the Federal Aviation Administration (FAA) is a MIE threshold 64a of greater than, or equal to, 200 µJ (two hundred microjoules). When the exact observed spark spectral signature 56 (see FIG. 1) of the observed spark 54 (see FIG. 1) from actual, tested test articles 23 (see FIG. 1), is duplicated, the digitally-controlled reference light source 12 (see FIG. 1) may be tuned down to a minimum ignition energy (MIE) intensity level 64b (see FIG. 1).

As shown in FIG. 1, the digitally-controlled reference light source 12, in the form of the digitally-controlled full-spectrum reference light source 12a, preferably comprises a light-emitting diode (LED) reference light source 86. The LED reference light source 86 (see FIG. 1) may comprise a tricolor LED (light-emitting diode) reference light source 90 (see FIG. 1), for example, an RGB LED (red, green, blue light-emitting diode) reference light source 88 (see FIG. 1), having an RGB (red, green, blue) light intensity ratio 100 (see FIG. 1) equivalent to an observed RGB (red, green, blue) light intensity ratio 102 (see FIG. 1) of the observed spark 54 (see FIG. 1). The RGB LED reference light source 88 (see FIG. 1) may be photographed or recorded to obtain a recorded RGB LED reference light source 88a (see FIG. 1). The RGB (red, green, blue) light intensity ratio 100 (see FIG. 1) and the observed RGB (red, green, blue) light intensity ratio 102 (see FIG. 1) may comprise a red (R) LED component 94 (see FIGS. 2A-2B), a green (G) LED component 96 (see FIGS. 2A-2B), and a blue (B) LED component 98 (see FIGS. 2A-2B) in a ratio 99 (see FIG. 1) of 1.0:0.3:0.1 (R:G:B), discussed in further detail below. Based on the detected ratio 99 of 1.0:0.3:0.1 (R:G:B), the spark color 51 (see FIG. 1) of the spark 48 (see FIG. 1) generated in an LDE test is orange-reddish in color, as opposed to the observed spark color 58 (see FIG. 1) of the observed spark 54, or standard sparker, which is bluish-purple in color.

As shown in FIGS. 1 and 2A, the LDE testing system 10 further comprises or includes a camera 104. The camera 104 preferably comprises one of, a digital camera 104a (see FIGS. 1, 2A), including a digital single lens reflex (DSLR) camera 104b (see FIG. 1), a charge coupled device (CCD) camera 104c (see FIG. 1), or another suitable camera 104. As shown in FIG. 2A, the camera 104, such as the digital camera 104a, has a camera lens 105 that may preferably be positioned to face opposite the test article 22 and the digitally-controlled reference light source 12, such as the digitally-controlled full-spectrum reference light source 12a. However, the camera 104 may be positioned in another suitable position or location at the test chamber 14. The camera 104 (see FIG. 1) may comprise a high-speed camera used for recording fast-moving objects, including sparks, sparking, or hot particle ejection, that occur in lightning direct effects (LDE) testing. A high-speed camera may be capable of capturing moving images with exposures of less than 1/1,000 second or frame rates in excess of 250 frames per second.

As shown in FIG. 2A, the camera, 104, such as in the form of digital camera 104a, is disposed, or positioned at, a location 106 at or in the test chamber 14. As shown in FIG. 2A, the camera lens 105 is inserted through the opening 20, such as the third opening 20c, of the test chamber 14. The camera 104, such as the digital camera 104a, has a field of view 108 (see FIG. 1) to detect and observe the spark 48 (see FIGS. 1, 2A) and the digitally-controlled reference light source 12 (see FIGS. 1, 2A), such as the digitally-controlled full-spectrum reference light source 12a (see FIGS. 1, 2A). The camera 104, such as the digital camera 104a is operable to capture or take, and captures or takes, an image 110 (see FIGS. 1, 3A-3B) that includes the spark spectral signature 50 (see FIGS. 1, 2A), the spark light intensity 52 (see FIG. 1), the reference light source spectral signature 80 (see FIGS. 1, 2A), and the reference light source light intensity 82 (see FIG. 1).

The LDE testing system 10 (see FIG. 1) may further comprise two or more mirrors 112 (see FIG. 1). Preferably, the LDE testing system 10 has two mirrors 112 comprising a first mirror 112a (see FIGS. 3A-3B) and a second mirror 112b (see FIGS. 3A-3B) disposed, or positioned, in the interior 16 (see FIG. 2A) of the test chamber 14 (see FIG. 2A). Each mirror 112 is preferably positioned at an angled position 116 (see FIGS. 1, 3A-3B) opposite each other, and with the test article 22 (see FIGS. 1, 2A, 3A-3B) positioned between the first mirror 112a and the second mirror 112b.

As shown in FIGS. 1 and 2A, the LDE testing system 10 further comprises or includes a controller system 118. The controller system 118 (see FIG. 2A) may be in the form of a digitally-controlled reference light source generating controller system 118a (see FIG. 2A). As shown in FIGS. 1 and 2A, the controller system 118 comprises a controller 120 operable to digitally control, and digitally controlling, the digitally-controlled reference light source 12, such as the digitally-controlled full-spectrum reference light source 12a. The controller 120 (see FIGS. 1, 2A) preferably comprises one of, a microcontroller 120a (see FIGS. 1, 2A), a microprocessor 120b (see FIG. 1), a computer controller 120c (see FIG. 1), or another suitable controller 120. For example, the controller 120 may comprises a microcontroller 120a, such as, an ATMEL microcontroller obtained from Atmel Corporation of San Jose, Calif. (ATMEL is a registered trademark of Atmel Corporation of San Jose, Calif.) However, other suitable microcontrollers 120a may also be used.

The controller 120 (see FIG. 2A), such as the microcontroller 120a (see FIG. 2A), preferably uses a quartz clock having an electronic oscillator regulated by a quartz crystal to keep time 160 (see FIG. 1) of each pulse 156 (see FIG. 1), or duration 162 (see FIG. 1) of each pulse 156, and thus, the time 160 of the pulse 156, or pulses 156, is preferably very accurate. The electronic oscillator regulated by the quartz crystal creates a signal with very precise frequency, so that quartz clocks are at least an order of magnitude more accurate than mechanical clocks. The pulse 156, or pulses 156, of the microcontroller 120a (see FIGS. 1, 2A) may be accurate and repeatable to a few microseconds, dependent of running clock frequency, for example, at 16 MHz (sixteen megahertz) for an ATMEL microcontroller. The duration 162 (see FIG. 1), or width, of the pulse 156 may be controlled down to the microsecond.

In one version, the controller 120 (see FIGS. 1, 2A) comprises a microcontroller 120a (see FIGS. 1, 2A), and the digitally-controlled reference light source 12 comprises a tricolor light-emitting diode (LED) reference light source 90 (see FIG. 1) controlled by the microcontroller 120a with pulse-duration modulation (PDM) 158 (see FIG. 1), or pulse-width modulation (PWM) 159 (see FIG. 1), to produce a pulsed programmable color 164 (see FIG. 1), or pulsed programmable hue. As used herein, "pulse-duration modulation (PDM)", also referred to as "pulse-width modulation (PWM)", means a modulation technique used to encode a message or current into a pulsing signal, that is, encoding information for transmission, and it is a technique that allows for control of power supplied to electrical devices.

As shown in FIGS. 1 and 2A, the controller system 118 further comprises an enclosure 126, such as a metallic enclosure 126a, or box, that encloses or houses the controller 120 within the enclosure 126. The controller system 118 further comprises an input portion 122 (see FIG. 2A) and an output portion 124 (see FIG. 2A) formed through the enclosure 126. The enclosure 126, such as the metallic enclosure 126a, protects the controller 120, such as the microcontroller 120a, or other suitable controller 120, and associated circuitry from LDE EMP (lightning direct effects electromagnetic pulse), by enclosing the electronics and associated circuitry in the metallic enclosure 126a, that functions essentially as a Faraday cage to block electromagnetic fields.

As shown in FIGS. 1 and 2A, the LDE testing system 10 further comprises or includes a current sensor probe assembly 128. The current sensor probe assembly 129 is coupled between the input portion 122 (see FIG. 2A) of the controller system 118, and the ground wire 44 (see FIGS. 1, 2A) and/or ground 46 (see FIGS. 1, 2A). Thus, the input portion 122 of the controller system 118 is coupled to the ground wire 44 and/or ground 46, via the current sensor probe assembly 128.

As shown in FIG. 2A, the current sensor probe assembly 128 preferably comprises a current sensor probe 130 and a cable connection 132, such as a shielded cable connection 134. The cable connection 132 (see FIG. 2A) has a first end 136 (see FIG. 2A) and a second end 138 (see FIG. 2A). As shown in FIG. 2A, the current sensor probe 130 is coupled to the ground wire 44 and/or to the ground 46, and the current sensor probe 130 is coupled to the first end 136 of the cable connection 132. As further shown in FIG. 2A, the second end 138 of the cable connection 132 is coupled to the input portion 122 of the controller system 118. The current sensor probe 130 of the current sensor probe assembly 128 (see FIG. 2A) senses the current 38 (see FIGS. 1, 2A) that is dissipated or discharged through the ground wire 44 to ground 46, and the current sensor probe 130 and the cable connection 132 of the current sensor probe assembly 128 send a current detection signal 140 (see FIGS. 1, 2A), such as an electrical signal 142 (see FIGS. 1, 2A), to the input portion 122 of the controller system 118. The current detection signal 140 (see FIGS. 1, 2A), such as the electrical signal 142 (see FIGS. 1, 2A), becomes an input trigger 144 (see FIGS. 1, 2A) to the controller 120 (see FIGS. 1, 2A), such as the microcontroller 120a. The current detection signal 140 (see FIGS. 1, 2A), such as the electrical signal 142 (see FIGS. 1, 2A), is input into the controller 120 (see FIGS. 1, 2A), such as the microcontroller 120a (see FIGS. 1, 2A), and the controller 120 (see FIGS. 1, 2A), such as the microcontroller 120a (see FIGS. 1, 2A) processes and releases electrical outputs 145 (see FIGS. 1, 2A).

FIG. 2A further shows a battery 146 having a voltage 148 coupled to the controller 120, such as the microcontroller 120a. The electrical outputs 145 (see FIG. 1, FIG. 2A) of current and the distribution of current, such as RGB LED currents 152 (see FIG. 1), may be balanced or adjusted by a plurality of resistive elements 150 (see FIG. 2A), including a first resistive element (R1) 150a (see FIG. 2A), a second resistive element (R2) 150b (see FIG. 2A), and a third resistive element (R3) 150c (see FIG. 2A).

FIG. 2A further shows a plurality of diodes 154, including a red diode (D1) 154a, a green diode (D2) 154b, and a blue diode (D3) 154c. As discussed above, the RGB (red, green, blue) light intensity ratio 100 (see FIG. 1) and the observed RGB (red, green, blue) light intensity ratio 102 (see FIG. 1) may comprise the red (R) LED component 94 (see FIGS. 2A-2B), the green (G) LED component 96 (see FIGS. 2A-2B), and the blue (B) LED component 98 (see FIGS. 2A-2B) in the ratio 99 (see FIG. 1) of 1.0:0.3:0.1 (R:G:B), or another suitable ratio.

The RGB LED components 94, 96, 98 are electro-optical elements having high quantum efficiencies, i.e., number of photons per number of electrons. Since the light emitting RGB LED components 94, 96, 98 generate light from their direct band gap transitions, they are independent of a known or standard black body radiation signature. Being independent of the thermodynamic limits of the known or standard black body radiation signature allows the light emitting RGB LED components 94, 96, 98 to be used as a high speed, pulsating light source for rapid optical communications.

The RGB LED reference light source 88 (see FIG. 1) may be used and digitally controlled by the controller 120, such as the microcontroller 120a, or another suitable controller 120, to make a composite light, or tricolor LED reference light source 90 (see FIG. 1), with three RGB LED components 94, 96, 98, and with the appropriate equivalent ratio as the observed spark 54 (see FIG. 1), or hot particle ejection, near the MIE (minimum ignition energy) threshold 64a (see FIG. 1). This is preferably achieved by pulse-duration modulation (PDM) 158 (see FIG. 1), or pulse-width modulation (PWM) 159 (see FIG. 1), for the three RGB LED components 94, 96, 98 (see FIG. 2A). FIG. 2A shows the RGB LED outputs 92 having the RGB LED components 94, 96, 98. The RGB LED outputs 92 (see FIGS. 1, 2A) have RGB LED currents 152 (see FIG. 1).

As shown in FIG. 2A, the controller system 118 further comprises a lens 165 configured to converge, and converging, the three RGB LED components 94, 96, 98 of the RGB LED outputs 92, into converged light 166, such as converged RGB (red, green, blue) light 166a, that produces emitted light 168. The LDE testing system 10 (see FIG. 1) uses the controller system 118 having the controller 120 (see FIG. 1) with pulse-duration modulation (PDM) 158 (see FIG. 1), or pulse-width modulation (PWM) 159 (see FIG. 1), to digitally control the digitally-controlled reference light source 12 (see FIG. 1), and to produce the emitted light 168 (see FIG. 1).

As shown in FIG. 2A, the controller system 118 further comprises a ground 169 to dissipate any current, if needed. As further shown in FIG. 2A, the controller system 118 comprises the output portion 124.

As shown in FIGS. 1A and 2, the LDE testing system 10 further comprises or includes a fiber optic link 170 that couples the output portion 124 of the controller system 118 to the digitally-controlled reference light source 12. The emitted light 168 (see FIG. 2A) is transferred, via the fiber optic link 170 (see FIG. 2A), from the controller system 118 (see FIGS. 1, 2A) to the digitally-controlled reference light source 12 (see FIGS. 1, 2A), such as the digitally-controlled full-spectrum reference light source 12a (see FIGS. 1, 2A).

As shown in FIG. 2A, the fiber optic link 170 has a first end 172a and a second end 172b. As further shown in FIG. 2A, the first end 172a of the fiber optic link 170 is coupled near, or to, the output portion 124 of the controller system 118, and the second end 172b of the fiber optic link 170 is coupled to the digitally-controlled reference light source 12. The fiber optic link 170 (see FIG. 2A) may comprise a spherical end bead 174 (see FIG. 2A) located within the test chamber 14. The spherical end bead 174 has a fixed coordinate reference light source sphere 176 (see FIG. 1) that emits a spherical uniform emission 178 (see FIGS. 1, 2A).

As shown in FIGS. 1 and 2A, the LDE testing system 10 further comprises or includes a computer system 180 coupled to the camera 104, such as the digital camera 104a, via a computer connection 181 (see FIG. 2A). The computer connection 181 (see FIG. 2A) may comprise a wired or wireless connection, or another suitable connection element. As further shown in FIGS. 1 and 2A, the computer system 180 may comprise at least one computer 182. The computer system 180 (see FIGS. 1, 2A) may be used to implement the at least one computer 182 (see FIGS. 1, 2A). As shown in FIGS. 1 and 2A, the computer system 180 further comprises computer software 184 and a computer processor 186. The at least one computer 182 may be connected to the controller system 118, or a separate computer may be connected to the controller system 118, if applicable or desired.

The at least one computer 182 may be configured to control one or more computing functions of one or more elements of the computer system 180 through computer program instructions, such as the computer software 184 (see FIGS. 1, 2A), stored on computer memory accessible to the computer 182. The computer software 184 (see FIGS. 1, 2A) may comprise an algorithm, a program code, computer firmware, or another suitable system logic. The computer software 184 may be loaded into the computer 182, the computer processor 186, or another programmable device, to configure and direct the computer 182, the computer processor 186, or another programmable device, to execute operations to be performed on, or by, the computer 182, the computer processor 186, or another programmable device, and to function in a particular way. Computer memory may comprise one or more of, a random-access memory (RAM), including dynamic and/or static RAM, on-chip or off-chip cache memory, or another suitable computer memory.

The computer system 180 (see FIGS. 1, 2A) receives, or is operable to receive, one or more images 110, captured or taken by the camera 104, of the spark spectral signature 50, the spark light intensity 52, the reference light source spectral signature 80, and the reference light source light intensity 82, for one or more lightning direct effects (LDE) tests. The computer 182, computer software 184, and computer processor 186, of the computer system 180, determine, or are operable to determine, a passing result 188 (see FIGS. 1, 3A) or a failing result 190 (see FIGS. 1, 3B), of a lightning direct effects (LDE) testing criteria 194 (see FIG. 1) for the test article 22 (see FIGS. 1, 3A-3B), by measuring and comparing the spark light intensity 52 (see FIGS. 1, 2A, 3A-3B) of the spark 48 (see FIGS. 1, 2A, 3A-3B) on or at the test article 22 against the reference light source light intensity 82 (see FIGS. 1, 2A, 3A-3B) of the digitally-controlled reference light source 12 (see FIGS. 1, 2A, 3A-3B), such as the digitally-controlled full-spectrum reference light source 12a (see FIGS. 1, 2A, 3A-3B).

If the spark light intensity 52 (see FIGS. 1, 3A) of the spark 48 (see FIGS. 1, 3A) is less than, i.e., dimmer than, the reference light source light intensity 82 (see FIGS. 1, 3A) in the image 110 (see FIGS. 1, 3A) captured by the camera 104 (see FIG. 1), the test article 22 (see FIGS. 1, 3A) passes the LDE testing criteria 194 (see FIG. 1). If the spark light intensity 52 (see FIGS. 1, 3B) of the spark 48 (see FIGS. 1, 3B) is equal to, or greater than, i.e., brighter than, the reference light source light intensity 82 (see FIGS. 1, 3B) in the image 110 (see FIGS. 1, 3B) captured by the camera 104 (see FIG. 1), the test article 22 (see FIGS. 1, 3B) fails the LDE testing criteria 194 (see FIG. 1). The LDE testing system 10 (see FIGS. 1, 2A) automates a pass/fail evaluation process 192 (see FIG. 1) for the test article 22 (see FIGS. 1, 2A).

Thus, the LDE testing system 10 (see FIGS. 1, 2A) is automated, programmable, and repeatable, as compared to known LDE testing systems and methods. The LDE testing system 10 (see FIGS. 1, 2A) has an increased repeatability 196 (see FIG. 1), as compared to known LDE testing systems and methods, an increased accuracy 198 (see FIG. 1), as compared to known LDE testing systems and methods, and calibration frequency elimination 200 (see FIG. 1) of the camera 104 (see FIG. 1). The LDE testing system 10 (see FIGS. 1, 2A) provides for a repeatable and accurate digitally-controlled reference light source 12 (see FIGS. 1, 2A), positioned at a fixed coordinate position 78a (see FIG. 2A), that simplifies the LDE testing by eliminating the need for frequent camera calibration, eliminating any variability in the image 110 (see FIG. 1) from the observed spark 54 (see FIG. 1), or reference sparker, and eliminating any difficulties with automating the pass/fail evaluation process 192. The only observed parameter for the LDE testing criteria 194 (see FIG. 1) and the pass/fail evaluation process 192 (see FIG. 1) is a simple, recorded RGB (red, green, blue) signature 89 (see FIG. 1), captured with a camera 104 (see FIG. 1).

Figure 2B:
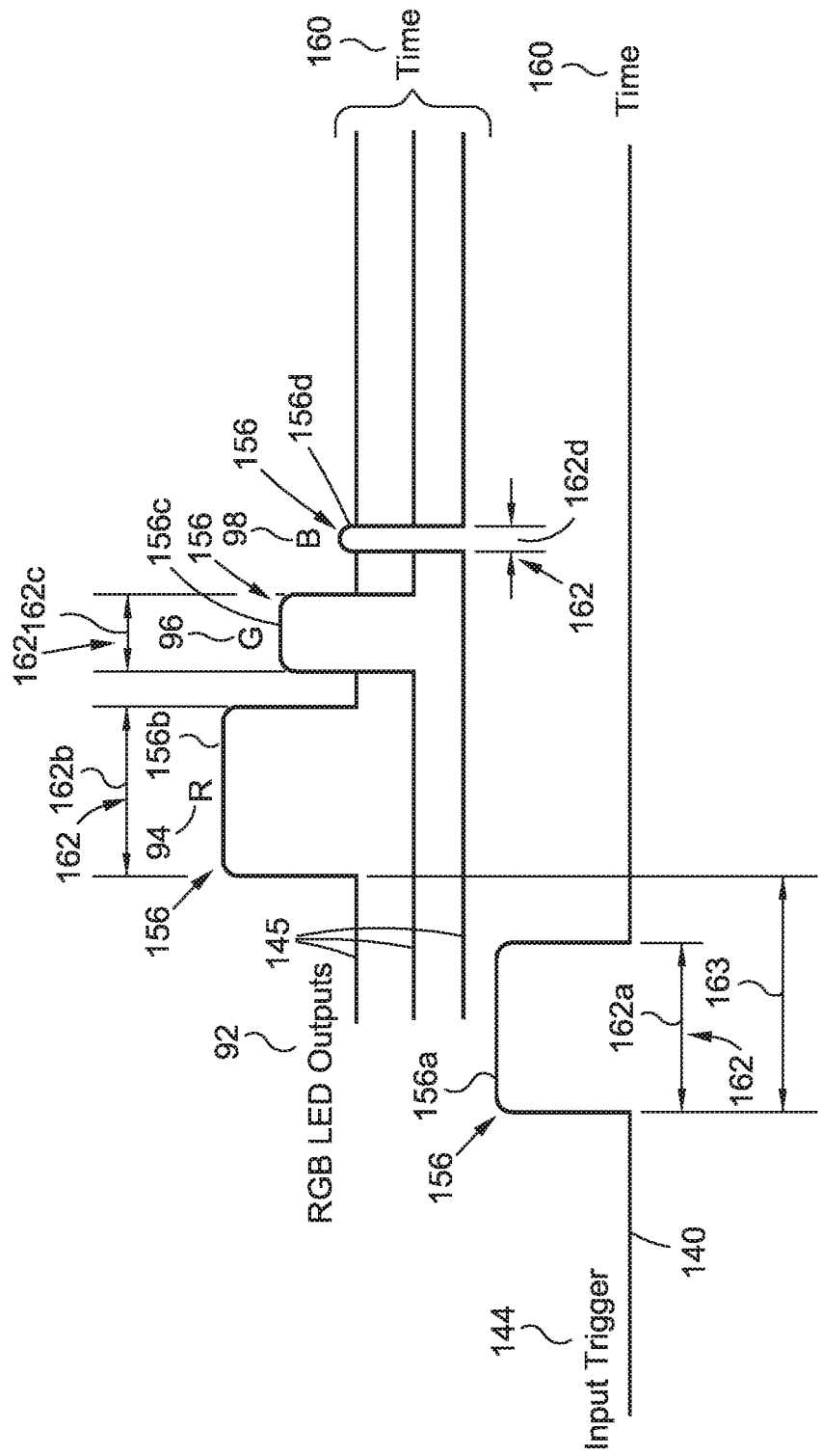
FIG. 2B is an illustration of an enlarged schematic diagram of an input trigger and RGB LED outputs that may be used in the lightning direct effects (LDE) testing system, such as shown in FIG. 2A.

Now referring to FIG. 2B, FIG. 2B is an illustration of an enlarged schematic diagram of the input trigger 144 and RGB LED (red, green, blue light-emitting diode) outputs 92 that may be used in the lightning direct effects (LDE) testing system 10, such as shown in FIG. 2A. As shown in FIG. 2B, the input trigger 140 has a pulse 156, such as a first pulse 156a, having a duration 162, or width, such as a first duration 162a, of time 160. As further shown in FIG. 2B, the RGB LED outputs 92, such as in the form of electrical outputs 145, include a red (R) LED (light-emitting diode) component 94, a green (G) LED component 96, and a blue (B) LED component 98. As shown in FIG. 2B, the electrical output 145 for the red (R) LED component 94 has a pulse 156, such as a second pulse 156b, having a duration 162, or width, such as a second duration 162b, of time 160. As shown in FIG. 2B, the electrical output 145 for the green (G) LED component 96 has a pulse 156, such as a third pulse 156c, having a duration 162, or width, such as a third duration 162c, of time 160. As shown in FIG. 2B, the electrical output 145 for the blue (B) LED component 94 has a pulse 156, such as a fourth pulse 156d, having a duration 162, or width, such as a fourth duration 162d, of time 160.

In this version of the RGB LED outputs 92 (see FIG. 2B), the pulse 156 (see FIG. 2B), such as the second pulse 156b (see FIG. 2B), of the red (R) LED component 94 (see FIG. 2B) has a greater duration 162 (see FIG. 2B), or width, than the pulse 156, such as the third pulse 156c (see FIG. 2B), of the green (G) LED component 96, and the pulse 156, such as the third pulse 156c, of the green (G) LED component 96 has a greater duration 162, or width, than the pulse 156, such as the fourth pulse 156d (see FIG. 2B), of the blue (B) LED component 98 (see FIG. 2B). As discussed above, the ratio 99 (see FIG. 1) of the red (R) LED component 94 (see FIG. 2B), the green (G) LED component 96 (see FIG. 2B), and the blue (B) LED component 98 (see FIG. 2B) may be 1.0:0.3:0.1 (R:G:B).

FIG. 2B further shows a delay 163 of time 160 from the beginning of the pulse 156, such as the first pulse 156a, of the input trigger 144 to the beginning of the pulse 156, such as the second pulse 156b, of the red (R) LED component 94. The durations 162 (see FIG. 2B), or widths, of the pulses 156 (see FIG. 2B) may be in milliseconds and may be controlled with the controller 120 (see FIG. 2A), such as the microcontroller 120a (see FIG. 2A), using pulse-duration modulation (PDM) 158 (see FIG. 1), or pulse-width modulation (PWM) 159 (see FIG. 1), and this may be used to digitally control the digitally-controlled reference light source 12 (see FIG. 2A), and to produce emitted light 168 (see FIG. 2A).

Figure 3A:
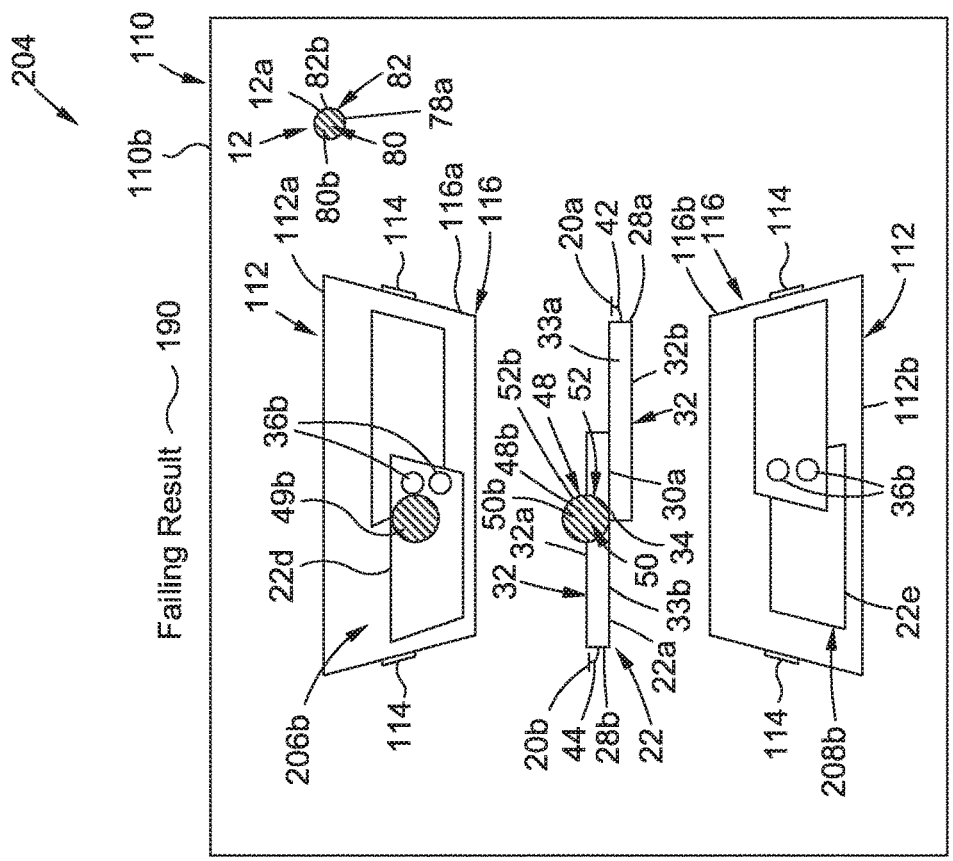
FIG. 3A is an illustration of a schematic diagram showing a front view of an image of a passing result from a first lightning direct effects (LDE) test using a version of a lightning direct effects (LDE) testing system of the disclosure.
Figure 3B:
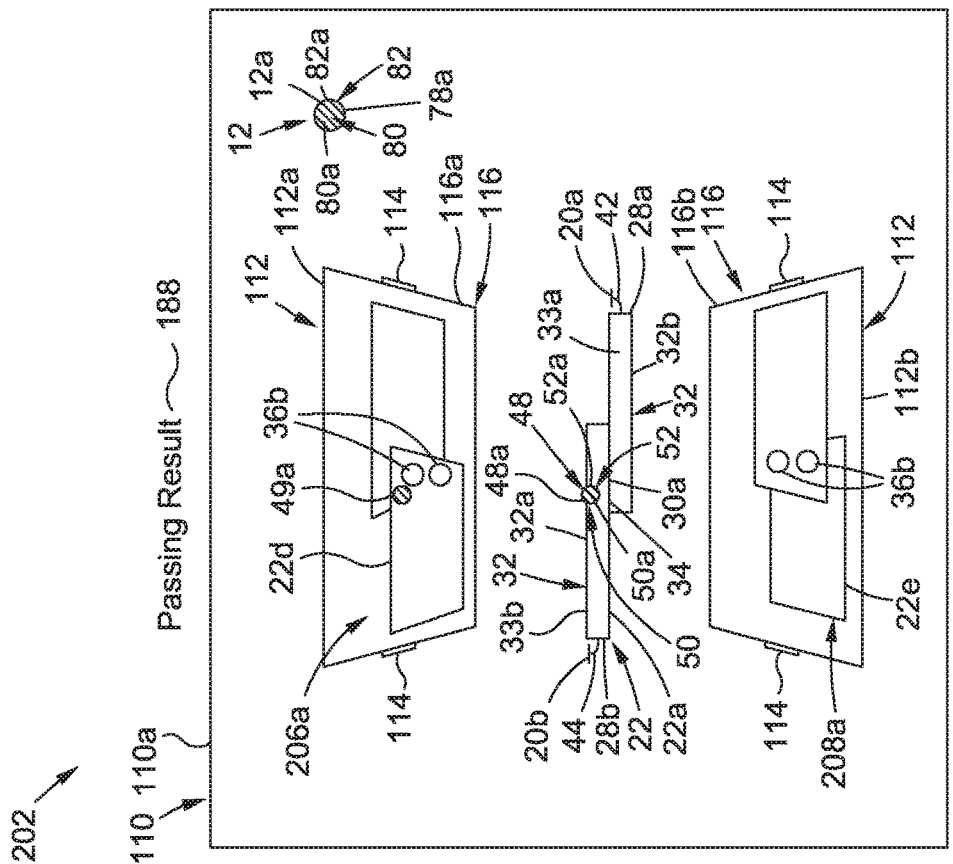
FIG. 3B is an illustration of a schematic diagram showing a front view of an image of a failing result from a second lightning direct effects (LDE) test using a version of a lightning direct effects (LDE) testing system of the disclosure.

Now referring to FIGS. 3A-3B, FIG. 3A is an illustration of a schematic diagram showing a front view of an image 110, such as a first image 110a, captured by a camera 104 (see FIGS. 1, 2A), of a passing result 188, from a first lightning direct effects (LDE) test 202, using a version of the lightning direct effects (LDE) testing system 10 (see FIGS. 1, 2A) of the disclosure. FIG. 3B is an illustration of a schematic diagram showing a front view of an image 110, such as a second image 110b, captured by a camera 104 (see FIGS. 1, 2A), of a failing result 190, from a second lightning direct effects (LDE) test 204 using a version of the lightning direct effects (LDE) testing system 10 (see FIGS. 1, 2A) of the disclosure.

As shown in FIG. 3A, the first image 110a captured, or recorded, by the camera 104 (see FIGS. 1, 2A), of the passing result 188, shows a spark 48, such as a first spark 48a, at the interface 34 of the test article 22, such as a lap joint 22a. As further shown in FIG. 3A, the spark 48, such as the first spark 48a, has a spark spectral signature 50, for example, a recorded spark spectral signature 50a, and has a spark light intensity 52, for example, a recorded spark light intensity 52a. As further shown in FIG. 3A, the digitally-controlled reference light source 12, such as the digitally-controlled full-spectrum reference light source 12*a*, is positioned at a fixed coordinate position 78*a*, proximate to the test article 22. The digitally-controlled reference light source 12 has a reference light source spectral signature 80, for example, a recorded reference light source spectral signature 80*a*, and a reference light source light intensity 82, for example, a recorded reference light source light intensity 82*a*.

In comparing the spark light intensity 52 of the first spark 48*a*, shown in FIG. 3A, against the reference light source light intensity 82 of the digitally-controlled reference light source 12, because the spark light intensity 52 is less than the reference light source light intensity 82 in the first image 110*a* captured by the camera 104, the test article 22 passes the lightning direct effects (LDE) testing criteria 194 (see FIG. 1) with a passing result 188. In the exaggerated schematic drawing of FIG. 3A, the spark 48, such as the first spark 48*a*, is depicted as smaller in size than the digitally-controlled reference light source 12, and this is meant to represent a spark light intensity 52 that is less than, or dimmer than, the reference light source light intensity 82.

As further shown in FIG. 3A, the first image 110*a* captured, or recorded, by the camera 104 (see FIGS. 1, 2A), shows a first image first mirror reflection 206*a*, including a test article first side reflection 22*d*, fastener reflections 36*b*, and a first spark reflection 49*a*. As further shown in FIG. 3A, the first image 110*a* captured, or recorded, by the camera 104 (see FIGS. 1, 2A), shows a first image second mirror reflection 208*a*, including a test article second side reflection 22*e* and fastener reflections 36*b*.

As shown in FIG. 3B, the second image 110*b* captured, or recorded, by the camera 104 (see FIGS. 1, 2A), of the failing result 190, shows a spark 48, such as a second spark 48*b*, at the interface 34 of the test article 22, such as a lap joint 22*a*. As further shown in FIG. 3B, the spark 48, such as the second spark 48*b*, has a spark spectral signature 50, for example, a recorded spark spectral signature 50*b*, and has a spark light intensity 52, for example, a recorded spark light intensity 52*b*. As further shown in FIG. 3B, the digitally-controlled reference light source 12, such as the digitally-controlled full-spectrum reference light source 12*a*, is positioned at a fixed coordinate position 78*a*, proximate to the test article 22. The digitally-controlled reference light source 12 has a reference light source spectral signature 80, for example, a recorded reference light source spectral signature 80*b*, and a reference light source light intensity 82, for example, a recorded reference light source light intensity 82*b*.

In comparing the spark light intensity 52 of the second spark 48*b*, shown in FIG. 3B, against the reference light source light intensity 82 of the digitally-controlled reference light source 12, because the spark light intensity 52 is greater than, or equal to, the reference light source light intensity 82 in the second image 110*b* captured by the camera 104, the test article 22 fails the lightning direct effects (LDE) testing criteria 194 (see FIG. 1) with a failing result 190. In the exaggerated schematic drawing of FIG. 3B, the spark 48, such as the second spark 48*b*, is depicted as larger in size than the digitally-controlled reference light source 12, and this is meant to represent a spark light intensity 52 that is greater than, or brighter than, the reference light source light intensity 82.

As further shown in FIG. 3B, the second image 110*b* captured, or recorded, by the camera 104 (see FIGS. 1, 2A), shows a second image first mirror reflection 206*b*, including a test article first side reflection 22*d*, fastener reflections 36*b*, and a second spark reflection 49*b*. As further shown in FIG. 3B, the second image 110*b* captured, or recorded, by the camera 104 (see FIGS. 1, 2A), shows a second image second mirror reflection 208*b*, including a test article second side reflection 22*e* and fastener reflections 36*b*.

As shown in FIGS. 3A-3B, the test article 22, such as the lap joint 22*a*, is positioned between the two mirrors 112, such as the first mirror 112*a* and the second mirror 112*b*. FIGS. 3A-3B show the first end 28*a*, the second end 28*b*, the front end 30*a*, and sides 32, such as the first side 32*a*, or top side, and such as the second side 32*b*, or bottom side, of the test article 22, such as the lap joint 22*a*. FIGS. 3A-3B further show the first portion 33*a* of the lap joint 22*a* joined to the second portion 33*b* of the lap joint 22*a* at the interface 34, with one or more fasteners 36 (see FIG. 2A), such as metal fasteners 36*a* (see FIG. 2A). FIGS. 3A-3B further show the capacitor wire 42 inserted through first opening 20*a* and attached to the first end 28*a* of the test article 22, and further show the ground wire 44 attached to the second end 28*b* of the test article 22 and inserted through second opening 20*b*. FIGS. 3A-3B further show a test article first side reflection 22*d* in the mirror 112, such as the first mirror 112*a*, and further show a test article second side reflection 22*e* in the mirror 112, such as the second mirror 112*b*. FIGS. 3A-3B further show fastener reflections 36*b* of fasteners 36 (see FIG. 2A) reflected in the mirrors 112, such as the first mirror 112*a* and the second mirror 112*b*.

As further shown in FIGS. 3A-3B, in one version, the mirror 112, such as the first mirror 112*a*, may be positioned near, or proximate to, the first side 32*a*, or top side, of the test article 22, and the mirror 112, such as the second mirror 112*b*, may be positioned opposite the first mirror 112*a* and near, or proximate to, the second side 32*b*, or bottom side, of the test article 22. Alternatively, the mirrors 112 and the test article 22 may be positioned in another suitable arrangement, with the mirrors 112 opposite each other, and the test article 22 between the mirrors 112, to capture various views of the spark 48 at the test article 22. Each mirror 112 (see FIGS. 3A-3B) may be secured in position on each side of the test article 22 with one or more securing elements 114 (see FIGS. 1, 3A-3B), such as in the form of clamps, fasteners, holders, or other suitable securing elements 114.

As further shown in FIGS. 3A and 3B, the mirrors 112, such as the first mirror 112*a* and the second mirror 112*b*, are preferably positioned at an angled position 116, on opposite sides 32 of the test article 22. The first mirror 112*a* (see FIGS. 3A-3B) is positioned at the angled position 116 (see FIGS. 3A-3B), such as a first angled position 116*a* (see FIGS. 3A-3B). The second mirror 112*b* (see FIGS. 3A-3B) is positioned at the angled position 116 (see FIGS. 3A-3B), such as a second angled position 116*b* (see FIGS. 3A-3B). The mirrors 112, such as the first mirror 112*a* and the second mirror 112*b*, may preferably be at the angled position 116, for example, a forty-five degree (45°) angled position, relative to the test article 22. Alternatively, the mirrors 112 may be angled at an angled position 116 of other suitable angle measurements, relative to the test article 22.

Figure 4:
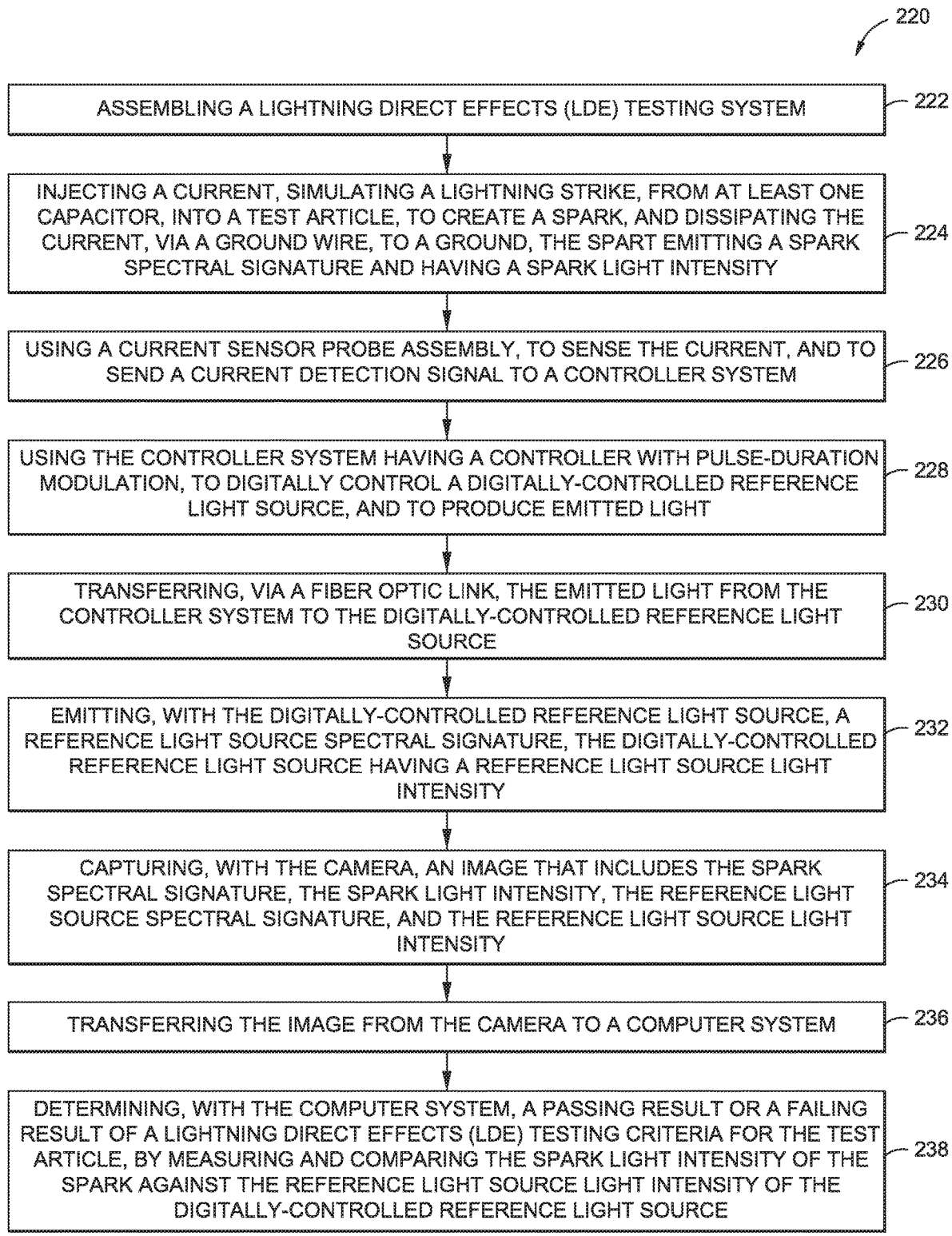
FIG. 4 is an illustration of a flow diagram showing a version of a lightning direct effects (LDE) testing method of the disclosure.

Now referring to FIG. 4, in another version there is provided a lightning direct effects (LDE) testing method 220 using a lightning direct effects (LDE) testing system 10 (see FIGS. 1, 2A). FIG. 4 is an illustration of a flow diagram showing a version of the LDE testing method 220 of the disclosure.

As shown in FIG. 4, the LDE testing method 220 comprises step 222 of assembling the lightning direct effects (LDE) testing system 10 (see FIGS. 1, 2A). As discussed in detail above, the LDE testing system 10 comprises the test chamber 14 (see FIGS. 1, 2A), or enclosed area or room, the test article 22 (see FIGS. 1, 2A), or test specimen, disposed in the test chamber 14, at least one capacitor 40 (see FIGS. 1, 2A) coupled, via the capacitor wire 41 (see FIG. 2A), to the first end 28a (see FIG. 2A) of the test article 22 (see FIG. 2A), and the ground wire 44 (see FIGS. 1, 2A) coupled to the second end 28b (see FIG. 2A) of the test article 22.

As discussed above, the LDE testing system 10 (see FIGS. 1, 2A) further comprises the digitally-controlled reference light source 12 (see FIGS. 1, 2A), such as in the form of the digitally-controlled full-spectrum reference light source 12a (see FIGS. 1, 2A), disposed in the test chamber 14 at the fixed coordinate position 78a (see FIG. 2A), proximate to the test article 22 (see FIG. 2A). The step 222 (see FIG. 4) of assembling the LDE testing system 10 (see FIGS. 1, 2A) may comprise using the digitally-controlled reference light source 12 (see FIGS. 1, 2A), in the form of a digitally-controlled full-spectrum reference light source 12a (see FIGS. 1, 2A), comprising an RGB LED (red, green, blue light-emitting diode) reference light source 88 (see FIG. 1) having an RGB (red, green, blue) light intensity ratio 100 (see FIG. 1) equivalent to an observed RGB (red, green, blue) light intensity ratio 102 (see FIG. 1) of the observed spark 54 (see FIG. 1). The step 222 of assembling the LDE testing system 10 (see FIGS. 1, 2A) may further comprise using the digitally-controlled reference light source 12 comprising the RGB LED (red, green, blue light-emitting diode) reference light source 88, wherein the RGB (red, green, blue) light intensity ratio 100 and the observed RGB (red, green, blue) light intensity ratio 102 comprise a red (R) LED component 94 (see FIG. 2A), a green (G) LED component 96 (see FIG. 2A), and a blue (B) LED component 98 (see FIG. 2A) in a ratio 99 (see FIG. 1) of 1.0:0.3:0.1 (R:G:B).

As discussed above, the LDE testing system 10 (see FIGS. 1, 2A) further comprises the camera 104 (see FIGS. 1, 2A) positioned at the test chamber 14 (see FIGS. 1, 2A). The camera 104 (see FIGS. 1, 2A) comprises the camera lens 105 (see FIG. 2A) facing the test article 22 and the digitally-controlled reference light source 12.

As discussed above, the LDE testing system 10 (see FIGS. 1, 2A) further comprises the controller system 118 (see FIGS. 1, 2A), such as the digitally-controlled reference light source generating controller system 118a (see FIG. 2A). The controller system 118 (see FIG. 2A) has the input portion 122 (see FIG. 2A) coupled to the ground wire 44 (see FIGS. 1, 2A) and/or the ground 46 (see FIGS. 1, 2A), via the current sensor probe assembly 128 (see FIGS. 1, 2A). The controller system 118 further has the output portion 124 (see FIG. 2A) coupled to the digitally-controlled reference light source 12 (see FIG. 2A), via the fiber optic link 170 (see FIG. 2A).

As discussed above, the LDE testing system 10 (see FIGS. 1, 2A) further comprises the computer system 180 (see FIGS. 1, 2A) coupled to the camera 104 (see FIGS. 1, 2A). The computer system 180 (see FIGS. 1, 2A) preferably comprises the computer 182 (see FIGS. 1, 2A), computer software 184 (see FIGS. 1, 2A), the computer processor 186 (see FIGS. 1, 2A), and other suitable computer system components, as desired.

The step 222 (see FIG. 4) of assembling the LDE testing system 10 (see FIGS. 1, 2A) may further comprise positioning the test article 22 (see FIGS. 1, 3A-3B) between the first mirror 112a (see FIGS. 3A-3B) and the second mirror 112b (see FIGS. 3A-3B) in the test chamber 14 (see FIG. 1). The first mirror 112a (see FIGS. 3A-3B) and the second mirror 112b (see FIGS. 3A-3B) are preferably each positioned at an angled position 116 (see FIGS. 1, 3A-3B) opposite each other, with the test article 22 in between the first mirror 112a and the second mirror 112b.

As shown in FIG. 4, the LDE testing method 220 further comprises step 224 of injecting current 38 (see FIGS. 1, 2A), such as a lightning direct effects (LDE) waveform 38a (see FIGS. 1, 2A), simulating a lightning strike 70 (see FIG. 1), from the at least one capacitor 40 (see FIGS. 1, 2A), into the test article 22 (see FIGS. 1, 2A), to create a spark 48 (see FIGS. 1, 2A), on the test article 22. The spark 48 emits the spark spectral signature 50 (see FIG. 1), and the spark 48 has a spark light intensity 52 (see FIG. 1). The step 224 (see FIG. 4) further comprises dissipating the current 38 (see FIGS. 1, 2A), via the ground wire 44 (see FIGS. 1, 2A), to a ground 46 (see FIGS. 1, 2A).

As shown in FIG. 4, the LDE testing method 220 further comprises step 226 of using the current sensor probe assembly 128 (see FIGS. 1, 2A), to sense the current 38, such as electric current 38b (see FIG. 1), and to send a current detection signal 140 (see FIGS. 1, 2A), such as an electrical signal 142 (see FIGS. 1, 2A), to the controller system 118 (see FIGS. 1, 2A).

As shown in FIG. 4, the LDE testing method 220 further comprises step 228 of using the controller system 118 (see FIGS. 1, 2A) having the controller 120 (see FIGS. 1, 2A), with pulse-duration modulation (PDM) 158 (see FIG. 1), to digitally control the digitally-controlled reference light source 12 (see FIGS. 1, 2A), and to produce emitted light 168 (see FIGS. 1, 2A). The step 228 of using the controller system 118 (see FIGS. 1, 2A) may further comprise using the controller system 118 (see FIGS. 1, 2A) having the controller 120 (see FIGS. 1, 2A) comprising one of, a microcontroller 120a (see FIGS. 1, 2A), a microprocessor 120b (see FIG. 1), a computer controller 120c (see FIG. 1), or another suitable controller 120.

As shown in FIG. 4, the LDE testing method 220 further comprises step 230 of transferring, via the fiber optic link 170 (see FIGS. 1, 2A), the emitted light 168 (see FIGS. 1, 2A) from the controller system 118 (see FIGS. 1, 2A) to the digitally-controlled reference light source 12 (see FIGS. 1, 2A).

As shown in FIG. 4, the LDE testing method 220 further comprises step 232 of emitting, with the digitally-controlled reference light source 12, the reference light source spectral signature 80 (see FIG. 1), simulating an observed spark spectral signature 56 (see FIG. 1) of sparking 66 (see FIG. 1) observed in tested test articles 23 (see FIG. 1). The digitally-controlled reference light source 12 (see FIGS. 1, 2A) has the reference light source light intensity 82 (see FIG. 1) that is equivalent to an observed spark light intensity 60 (see FIG. 1) of an observed spark 54 (see FIG. 1) having an energy 62 (see FIG. 1) equal to a minimum ignition energy (MIE) threshold 64a (see FIG. 1).

As shown in FIG. 4, the LDE testing method 220 further comprises step 234 of capturing, with the camera 104 (see FIGS. 1, 2A), an image 110 (see FIGS. 1, 3A-3B) that includes the spark spectral signature 50 (see FIGS. 1, 3A-3B), the spark light intensity 52 (see FIGS. 1, 3A-3B), the reference light source spectral signature 80 (see FIGS. 1, 3A-3B), and the reference light source light intensity 82 (see FIGS. 1, 3A-3B).

As shown in FIG. 4, the LDE testing method 220 further comprises step 236 of transferring the image 110 (see FIGS. 1, 3A-3B) from the camera 104 (see FIGS. 1, 2A) to the computer system 180 (see FIGS. 1, 2A).

As shown in FIG. 4, the LDE testing method 220 further comprises step 238 of determining, with the computer system 180 (see FIGS. 1, 2A), a passing result 188 (see FIGS. 1, 3A) or a failing result 190 (see FIGS. 1, 3B) of a lightning direct effects (LDE) testing criteria 194 (see FIG. 1) for the test article 22 (see FIG. 1), by measuring and comparing the spark light intensity 52 (see FIGS. 1, 3A-3B) of the spark 48 (see FIGS. 1, 3A-3B) on or at the test article 22 (see FIGS. 1, 3A-3B), against the reference light source light intensity 82 (see FIGS. 1, 3A-3B) of the digitally-controlled reference light source 12 (see FIGS. 1, 3A-3B).

The step 238 (see FIG. 4) of determining the passing result 188 (see FIG. 3A) or the failing result 190 (see FIG. 3B) further comprises determining that the test article 22 (see FIG. 3A) passes the lightning direct effects (LDE) testing criteria 194 (see FIG. 1), if the spark light intensity 52 (see FIGS. 1, 3A) is less than the reference light source light intensity 82 (see FIGS. 1, 3A) in the image 110 (see FIGS. 1, 3A), such as the first image 110a (see FIG. 3A), captured by the camera 104 (see FIGS. 1, 2A), and further comprises determining that the test article 22 (see FIG. 3B) fails the LDE testing criteria 194 (see FIG. 1), if the spark light intensity 52 (see FIGS. 1, 3B) is equal to, or greater than, the reference light source light intensity 82 (see FIGS. 1, 3B) in the image 110 (see FIG. 3B), such as the second image 110b (see FIG. 3B), captured by the camera 104.

Figure 5:
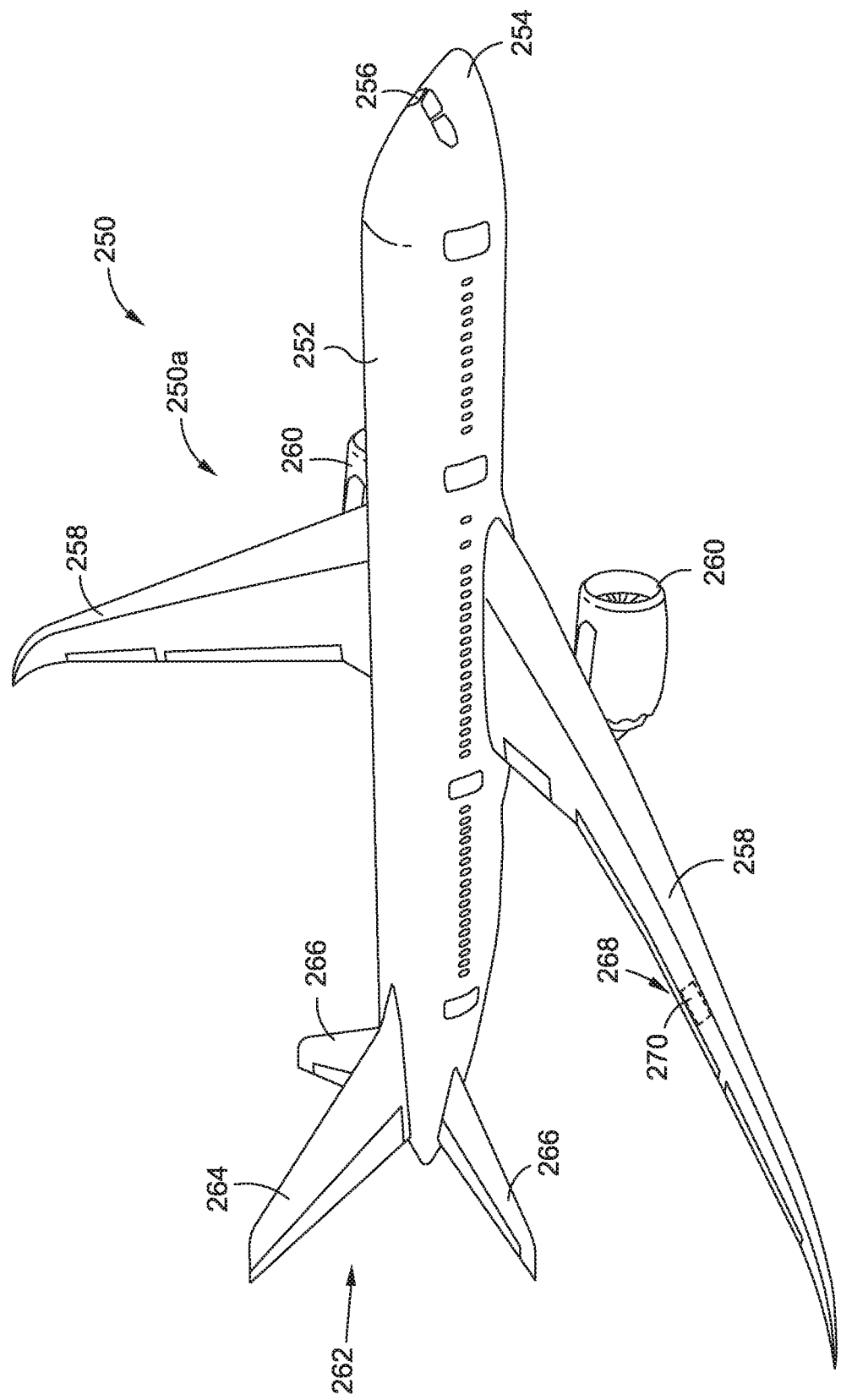
FIG. 5 is an illustration of a perspective view of an aircraft incorporating a structure that may be tested using the lightning direct effects (LDE) testing system and lightning direct effects (LDE) testing method of the disclosure.

Now referring to FIG. 5, FIG. 5 is an illustration of a perspective view of an air vehicle 250, such as an aircraft 250a, incorporating a structure 268, such as a composite structure 270, for example, an aircraft wing panel, that may be tested using the LDE testing system 10 (see FIGS. 1, 2A) and the LDE testing method 220 (see FIG. 4) of the disclosure. As shown in FIG. 5, the air vehicle 250, such as the aircraft 250a, comprises a fuselage 252, a nose 254, a cockpit 256, a pair of wings 258 and engines 260, and an empennage 262 comprising a horizontal stabilizer 264 and vertical stabilizers 266.

Figure 6:
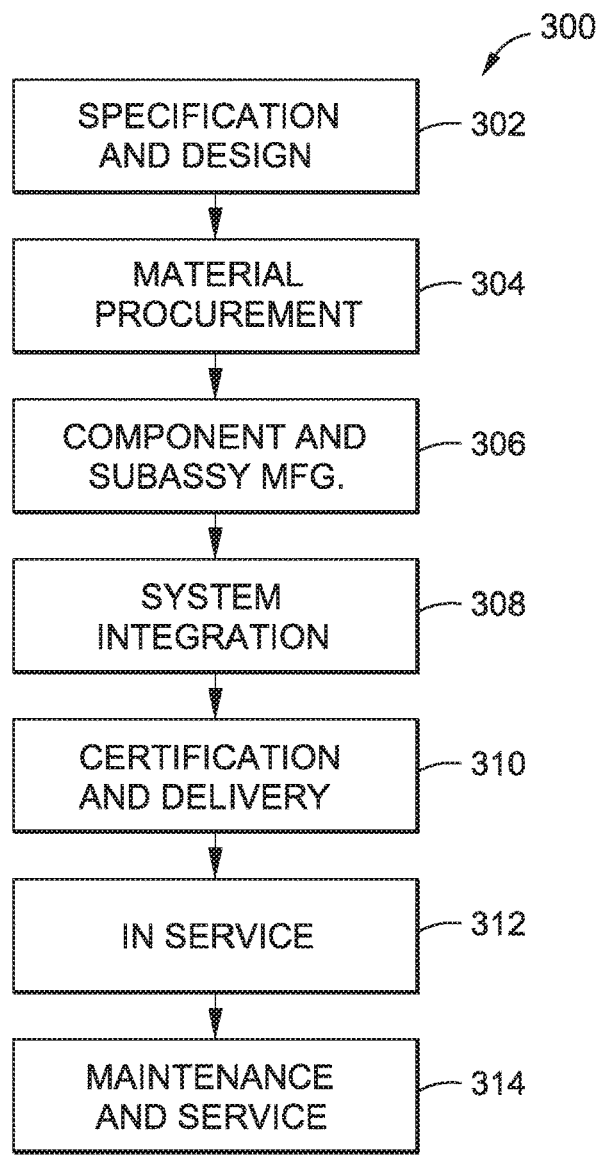
FIG. 6 is an illustration of a flow diagram of an aircraft manufacturing and service method.
Figure 7:
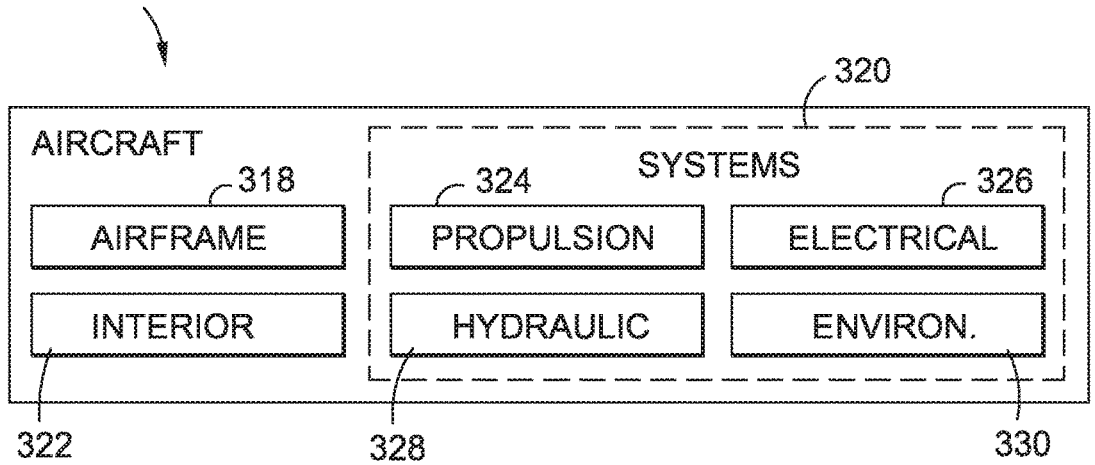
FIG. 7 is an illustration of a block diagram of an aircraft.

Now referring to FIGS. 6 and 7, FIG. 6 is an illustration of a flow diagram of an aircraft manufacturing and service method 300, and FIG. 7 is an illustration of a block diagram of an aircraft 316. Referring to FIGS. 6 and 7, versions of the disclosure may be described in the context of the aircraft manufacturing and service method 300 as shown in FIG. 6, and the aircraft 316 as shown in FIG. 7.

During pre-production, exemplary aircraft manufacturing and service method 300 may include specification and design 302 of the aircraft 316 and material procurement 304. During manufacturing, component and subassembly manufacturing 306 and system integration 308 of the aircraft 316 takes place. Thereafter, the aircraft 316 may go through certification and delivery 310 in order to be placed in service 312. While in service 312 by a customer, the aircraft 316 may be scheduled for routine maintenance and service 314 (which may also include modification, reconfiguration, refurbishment, and other suitable services).

Each of the processes of the aircraft manufacturing and service method 300 may be performed or carried out by a system integrator, a third party, and/or an operator (e.g., a customer). For the purposes of this description, a system integrator may include, without limitation, any number of aircraft manufacturers and major-system subcontractors. A third party may include, without limitation, any number of vendors, subcontractors, and suppliers. An operator may include an airline, leasing company, military entity, service organization, and other suitable operators.

As shown in FIG. 7, the aircraft 316 produced by the exemplary aircraft manufacturing and service method 300 may include an airframe 318 with a plurality of systems 320 and an interior 322. Examples of the plurality of systems 320 may include one or more of a propulsion system 324, an electrical system 326, a hydraulic system 328, and an environmental system 330. Any number of other systems may be included. Although an aerospace example is shown, the principles of the disclosure may be applied to other industries, such as the automotive industry.

Methods and systems embodied herein may be employed during any one or more of the stages of the aircraft manufacturing and service method 300. For example, components or subassemblies corresponding to component and subassembly manufacturing 306 may be fabricated or manufactured in a manner similar to components or subassemblies produced while the aircraft 316 is in service 312. Also, one or more apparatus embodiments, method embodiments, or a combination thereof, may be utilized during component and subassembly manufacturing 306 and system integration 308, for example, by substantially expediting assembly of or reducing the cost of the aircraft 316. Similarly, one or more of apparatus embodiments, method embodiments, or a combination thereof, may be utilized while the aircraft 316 is in service 312, for example and without limitation, to maintenance and service 314.

Disclosed versions of the lighting direct effects (LDE) testing system 10 (see FIGS. 1, 2A) and the lighting direct effects (LDE) testing method 220 (see FIG. 4) provide for an objective, rather than a subjective, system and method for lighting direct effects (LDE) testing of test articles 22 (see FIG. 1), using a digitally-controlled reference light source 12 (see FIG. 1), such as a digitally-controlled full-spectrum reference light source 12a (see FIG. 1), that is positioned in a fixed coordinate position 78a (see FIG. 2A) in a test chamber 14 (see FIG. 2A). The digitally-controlled reference light source 12 preferably comprises an RGB LED (red, green, blue light-emitting diode) reference light source 88 having an RGB (red, green, blue) light intensity ratio 100 (see FIG. 1) equivalent to an observed RGB (red, green, blue) light intensity ratio 102 (see FIG. 1) of an observed spark 54 (see FIG. 1). The reference light source light intensity 82 (see FIG. 1) of the digitally-controlled reference light source 12 is configured to simulate the observed spark light intensity 60 (see FIG. 1) of the observed spark 54 (see FIG. 1), and is compared against the spark light intensity 52 (see FIG. 1) of the spark 48 (see FIG. 1) created in the test chamber 14 (see FIG. 1). The LDE testing system 10 and the LDE testing method 220 preferably use a tricolor LED reference light source 90 (see FIG. 1), digitally controlled by the controller system 118, with the controller 120, such as the microcontroller 120a, using pulse-duration modulation (PDM) 158 (see FIG. 1), or pulse-width modulation (PWM) 159 (see FIG. 1), to produce a pulsed programmable color 164 (see FIG. 1), or hue, intensity light source that can be set or programmed to mimic the applicable MIE (minimum ignition energy) threshold 64a (see FIG. 1). The camera 104 (see FIG. 1) captures, and is operable to capture, the image 110 (see FIG. 1) of the spark spectral signature 50 (see FIG. 1), the spark light intensity 52 (see FIG. 1), the reference light source spectral signature 80 (see FIG. 1), and the reference light source light intensity 82 (see FIG. 1), during the lightning direct effects (LDE) test. The LDE testing system 10 and the LDE testing method 220 are automated and provide a pass/fail evaluation process 192 (see FIG. 1) for the test article 22 (see FIG. 1) that is automated.

In addition, disclosed versions of the LDE testing system 10 (see FIGS. 1, 2A) and LDE testing method 220 (see FIG. 4) provide for an increased repeatability 196 (see FIG. 1), as compared to known LDE testing systems and methods, an increased accuracy 198 (see FIG. 1), as compared to known LDE testing systems and methods, and calibration frequency elimination 200 (see FIG. 1) of the camera 104 (see FIG. 1). The LDE testing system 10 (see FIGS. 1, 2A) provides for a repeatable and accurate digitally-controlled reference light source 12 (see FIGS. 1, 2A), positioned at the fixed coordinate position 78a (see FIG. 2A), that simplifies the LDE testing by eliminating the need for frequent camera calibration, eliminating any variability in the image 110 (see FIG. 1) from the observed spark 54 (see FIG. 1), or reference sparker, and eliminating any difficulties with automating the pass/fail evaluation process 192.

Moreover, disclosed versions of the LDE testing system 10 (see FIGS. 1, 2A) and LDE testing method 220 (see FIG. 4) allow for an automated LDE test that increases the speed of testing test articles 22 (see FIG. 1), such as lap joints 22a (see FIG. 1), for aircraft structures, in lighting protection. Moreover, disclosed versions of the LDE testing system 10 (see FIGS. 1, 2A) and LDE testing method 220 (see FIG. 4) solves any calibration issues of a reference light source image for LDE testing. Further, disclosed versions of the LDE testing system 10 (see FIGS. 1, 2A) and LDE testing method 220 (see FIG. 4) reduce test complications and repeatability with the digitally-controlled reference light source 12, and eliminate the need for calibration of the camera 104.

In addition, disclosed versions of the LDE testing system 10 (see FIGS. 1, 2A) and LDE testing method 220 (see FIG. 4) provide for programmability and control over the digitally-controlled reference light source 12 (see FIG. 1) and reference light source spectral signature 80 (see FIG. 1) and reference light source light intensity 82 (see FIG. 1), as compared to know LDE testing systems and methods. The digitally-controlled reference light source 12 that is digitally controlled with the control system 118 having the controller 120, such as the microcontroller 120a, or other suitable controller 120, is more accurate, repeatable, and reliable, as compared to a standard sparker, and has no dependency on environmental parameters, such as relative humidity, ambient temperature, cosmic rays, and other environmental parameters or factors.

Many modifications and other versions or embodiments of the disclosure will come to mind to one skilled in the art to which this disclosure pertains having the benefit of the teachings presented in the foregoing descriptions and the associated drawings. The versions or embodiments described herein are meant to be illustrative and are not intended to be limiting or exhaustive. Although specific terms are employed herein, they are used in a generic and descriptive sense only and not for purposes of limitation.

What is claimed is:

1. A lightning direct effects (LDE) testing system comprising:
    a test chamber;
    a test article disposed in the test chamber;
    at least one capacitor coupled, via a capacitor wire, to the test article, the at least one capacitor operable to inject a current, simulating a lightning strike, into the test article, to create a spark on the test article, the spark emitting a spark spectral signature, and the spark having a spark light intensity, and the test article coupled to a ground wire dissipating the current to a ground;
    a digitally-controlled reference light source disposed in the test chamber, the digitally-controlled reference light source operable to emit a reference light source spectral signature simulating an observed spark spectral signature of sparking in tested test articles, and the digitally-controlled reference light source having a reference light source light intensity equivalent to an observed spark light intensity of an observed spark having an energy equal to a minimum ignition energy (MIE) threshold;
    a camera positioned at the test chamber, the camera having a camera lens facing the test article and the digitally-controlled reference light source, and having a field of view to detect the spark and the digitally-controlled reference light source, and the camera operable to capture an image that includes the spark spectral signature, the spark light intensity, the reference light source spectral signature, and the reference light source light intensity;
    a controller system having a controller operable to digitally control the digitally-controlled reference light source, the controller system having an input portion coupled to the ground wire, via a current sensor probe assembly, and the controller system having an output portion coupled to the digitally-controlled reference light source, via a fiber optic link; and
    a computer system coupled to the camera, to receive the image, and to determine a passing result or a failing result of a lightning direct effects (LDE) testing criteria for the test article, by measuring and comparing the spark light intensity of the spark on the test article against the reference light source light intensity of the digitally-controlled reference light source.

2. The lightning direct effects (LDE) testing system of claim 1, further comprising a first mirror and a second mirror disposed in the test chamber, each positioned at an angled position opposite each other, and with the test article positioned between the first mirror and the second mirror.

3. The lightning direct effects (LDE) testing system of claim 1, wherein the test article comprises one of, a lap joint, a panel, and an aircraft structure, each test article made of a test article material comprising one of, a composite material, a metal material, and a combined composite/metal material.

4. The lightning direct effects (LDE) testing system of claim 1, wherein the current injected into the test article comprises a lightning direct effects (LDE) waveform.

5. The lightning direct effects (LDE) testing system of claim 1, wherein the digitally-controlled reference light source comprises a digitally-controlled full-spectrum reference light source, comprising an RGB LED (red, green, blue light-emitting diode) reference light source having an RGB (red, green, blue) light intensity ratio equivalent to an observed RGB (red, green, blue) light intensity ratio of the observed spark.

6. The lightning direct effects (LDE) testing system of claim 5, wherein the RGB (red, green, blue) light intensity ratio and the observed RGB (red, green, blue) light intensity ratio comprise a red (R) LED component, a green (G) LED component, and a blue (B) LED component in a ratio of 1.0:0.3:0.1 (R:G:B).

7. The lightning direct effects (LDE) testing system of claim 1, wherein the camera comprises one of, a digital camera, including a digital single lens reflex (DSLR) camera, and a charge coupled device (CCD) camera.

8. The lightning direct effects (LDE) testing system of claim 1, wherein the controller comprises one of, a microcontroller, a microprocessor, and a computer controller.

9. The lightning direct effects (LDE) testing system of claim 1, wherein the controller comprises a microcontroller, and the digitally-controlled reference light source comprises a tricolor light-emitting diode (LED) reference light source controlled by the microcontroller with pulse-duration modulation (PDM), to produce emitted light.

10. The lightning direct effects (LDE) testing system of claim 1, wherein if the spark light intensity is less than the reference light source light intensity in the image captured by the camera, the test article passes the lightning direct effects (LDE) testing criteria, and if the spark light intensity is equal to, or greater than, the reference light source light intensity in the image captured by the camera, the test article fails the lightning direct effects (LDE) testing criteria.

11. A lightning direct effects (LDE) testing system using a digitally-controlled reference light source, the lightning direct effects (LDE) testing system comprising:
   a test chamber;
   a test article disposed in the test chamber;
   at least one capacitor coupled, via a capacitor wire, to a first end of the test article, the at least one capacitor operable to inject a current, simulating a lightning strike, into the test article, to create a spark on the test article, the spark emitting a spark spectral signature, and the spark having a spark light intensity;
   a ground wire coupled to a second end of the test article, the ground wire dissipating the current to a ground;
   a first mirror and a second mirror disposed in the test chamber, opposite each other, with the test article positioned between the first mirror and the second mirror;
   a digitally-controlled reference light source disposed in the test chamber at a fixed coordinate position proximate to the test article, and the digitally-controlled reference light source operable to emit a reference light source spectral signature simulating an observed spark spectral signature of sparking observed in tested test articles, and the digitally-controlled reference light source having a reference light source light intensity that is equivalent to an observed spark light intensity of an observed spark having an energy equal to a minimum ignition energy (MIE) threshold;
   a camera positioned at the test chamber, the camera having a camera lens facing the test article and the digitally-controlled reference light source, and having a field of view to detect the spark and the digitally-controlled reference light source, and the camera operable to capture an image that includes the spark spectral signature, the spark light intensity, the reference light source spectral signature, and the reference light source light intensity;
   a controller system having a controller operable to digitally control the digitally-controlled reference light source;
   a current sensor probe assembly coupled between the ground wire and the controller system, the current sensor probe assembly comprising a current sensor probe and a cable connection;
   a fiber optic link coupled between the controller system and the digitally-controlled reference light source;
   and a computer system coupled to the camera, to receive the image, and to determine a passing result or a failing result of a lightning direct effects (LDE) testing criteria for the test article, by measuring and comparing the spark light intensity of the spark on the test article against the reference light source light intensity of the digitally-controlled reference light source,
   wherein if the spark light intensity is less than the reference light source light intensity in the image captured by the camera, the test article passes the lightning direct effects (LDE) testing criteria, and if the spark light intensity is equal to, or greater than, the reference light source light intensity in the image captured by the camera, the test article fails the lightning direct effects (LDE) testing criteria.

12. The lightning direct effects (LDE) testing system of claim 11, wherein the test article comprises one of, a lap joint, a panel, and an aircraft structure, and each test article is made of a test article material comprising one of, a composite material, a metal material, and a combined composite/metal material, and each test article has at least one metal fastener.

13. The lightning direct effects (LDE) testing system of claim 11, wherein the digitally-controlled reference light source comprises a digitally-controlled full-spectrum reference light source comprising an RGB LED (red, green, blue light-emitting diode) reference light source having an RGB (red, green, blue) light intensity ratio equivalent to an observed RGB (red, green, blue) light intensity ratio of the observed spark.

14. The lightning direct effects (LDE) testing system of claim 13, wherein the RGB (red, green, blue) light intensity ratio and the observed RGB (red, green, blue) light intensity ratio comprise a red (R) LED component, a green (G) LED component, and a blue (B) LED component in a ratio of 1.0:0.3:0.1 (R:G:B).

15. A lightning direct effects (LDE) testing method using a lightning direct effects (LDE) testing system, the lightning direct effects (LDE) testing method comprising the steps of:
   assembling the lightning direct effects (LDE) testing system comprising:
      a test chamber;
      a test article disposed in the test chamber;
      at least one capacitor coupled, via a capacitor wire, to a first end of the test article;
      a ground wire coupled to a second end of the test article;
      a digitally-controlled reference light source disposed in the test chamber at a fixed coordinate position proximate to the test article;
      a camera positioned at the test chamber, the camera having a camera lens facing the test article and the digitally-controlled reference light source;
      a controller system having an input portion coupled to the ground wire, via a current sensor probe assembly, and the controller system having an output portion coupled to the digitally-controlled reference light source, via a fiber optic link; and
      a computer system coupled to the camera;
   injecting a current, simulating a lightning strike, from the at least one capacitor, into the test article, to create a spark, on the test article, and dissipating the current, via the ground wire, to a ground, the spark emitting a spark spectral signature, and the spark having a spark light intensity;
   using the current sensor probe assembly, to sense the current, and to send a current detection signal to the controller system;
   using the controller system having a controller with pulse-duration modulation (PDM), to digitally control the digitally-controlled reference light source, and to produce emitted light;
   transferring, via the fiber optic link, the emitted light from the controller system to the digitally-controlled reference light source;
   emitting, with the digitally-controlled reference light source, a reference light source spectral signature simulating an observed spark spectral signature of sparking observed in tested test articles, the digitally-controlled reference light source having a reference light source light intensity that is equivalent to an observed spark light intensity of an observed spark having an energy equal to a minimum ignition energy (MIE) threshold;

capturing, with the camera, an image that includes the spark spectral signature, the spark light intensity, the reference light source spectral signature, and the reference light source light intensity;

transferring the image from the camera to the computer system; and determining, with the computer system, a passing result or a failing result of a lightning direct effects (LDE) testing criteria for the test article, by measuring and comparing the spark light intensity of the spark on the test article against the reference light source light intensity of the digitally-controlled reference light source.

16. The lightning direct effects (LDE) testing method of claim 15, wherein assembling the LDE testing system further comprises, positioning the test article between a first mirror and a second mirror in the test chamber, the first mirror and the second mirror each positioned at an angled position opposite each other.

17. The lightning direct effects (LDE) testing method of claim 15, wherein assembling the LDE testing system comprises, using the digitally-controlled reference light source comprising a digitally-controlled full-spectrum reference light source, comprising an RGB LED (red, green, blue light-emitting diode) reference light source having an RGB (red, green, blue) light intensity ratio equivalent to an observed RGB (red, green, blue) light intensity ratio of the observed spark.

18. The lightning direct effects (LDE) testing method of claim 17, wherein assembling the LDE testing system using the digitally-controlled reference light source comprises the RGB LED (red, green, blue light-emitting diode) reference light source, wherein the RGB (red, green, blue) light intensity ratio and the observed RGB (red, green, blue) light intensity ratio comprise a red (R) LED component, a green (G) LED component, and a blue (B) LED component in a ratio of 1.0:0.3:0.1 (R:G:B).

19. The lightning direct effects (LDE) testing method of claim 15, wherein using the controller system comprises, using the controller system having the controller comprising one of, a microcontroller, a microprocessor, and a computer controller.

20. The lightning direct effects (LDE) testing method of claim 15, wherein determining the passing result or the failing result comprises, determining the test article passes the lightning direct effects (LDE) testing criteria, if the spark light intensity is less than the reference light source light intensity in the image captured by the camera, and further comprises determining the test article fails the LDE testing criteria, if the spark light intensity is equal to, or greater than, the reference light source light intensity in the image captured by the camera.

* * * * *